(12) United States Patent
Ikenaga et al.

(10) Patent No.: US 8,945,701 B2
(45) Date of Patent: Feb. 3, 2015

(54) ETHYLENE RESIN COMPOSITION, SEALING MATERIAL FOR SOLAR CELL, AND SOLAR CELL MODULE UTILIZING THE SEALING MATERIAL

(75) Inventors: Shigenobu Ikenaga, Chiba (JP); Takashi Hakuta, Sodegaura (JP); Kazuhiro Yarimizu, Fujisawa (JP); Hiroshi Mori, Ichihara (JP); Takanobu Murofushi, Ichihara (JP); Hirofumi Zenkoh, Chiba (JP); Jun Tokuhiro, Shinagawa-ku (JP); Fumito Takeuchi, Chiba (JP)

(73) Assignee: Mitsui Chemicals Tohcello, Inc., Tokyo (JP)

( * ) Notice: Subject to any disclaimer, the term of this patent is extended or adjusted under 35 U.S.C. 154(b) by 463 days.

(21) Appl. No.: 13/375,771

(22) PCT Filed: May 31, 2010

(86) PCT No.: PCT/JP2010/003648
§ 371 (c)(1),
(2), (4) Date: Dec. 1, 2011

(87) PCT Pub. No.: WO2010/140343
PCT Pub. Date: Dec. 9, 2010

(65) Prior Publication Data
US 2012/0073631 A1     Mar. 29, 2012

(30) Foreign Application Priority Data

Jun. 1, 2009   (JP) .................. 2009-132432
Oct. 15, 2009  (JP) .................. 2009-238653

(51) Int. Cl.
*H01L 31/048*   (2014.01)
*B32B 3/30*     (2006.01)
(Continued)

(52) U.S. Cl.
CPC .............. *C08L 23/26* (2013.01); *C08F 255/02* (2013.01); *C08L 51/06* (2013.01);
(Continued)

(58) Field of Classification Search
CPC ............. H01L 31/048; H01L 31/0482; H01L 31/0422; C08F 255/02; C08F 8/42; C08F 291/00; C08F 297/02; C08C 19/00; C08L 2205/02; C08L 23/0815; C08L 23/10; C08L 23/06; C08L 23/16; C08J 5/06; C08J 2321/00
USPC ................... 136/251; 525/288, 240; 524/585; 428/159
See application file for complete search history.

(56) References Cited

U.S. PATENT DOCUMENTS 6,660,556 B2    12/2003  Hashimoto et al.
2005/0051204 A1  3/2005  Ol et al.
(Continued)

FOREIGN PATENT DOCUMENTS

JP    08-283696 A    10/1996
JP    2000-091611 A   3/2000
(Continued)

OTHER PUBLICATIONS

Machine translation of JP 2007-150094. (original reference provided by Applicant).*
(Continued)

*Primary Examiner* — Ling Choi
*Assistant Examiner* — Catherine S Branch
(74) *Attorney, Agent, or Firm* — Buchanan, Ingersoll & Rooney PC

(57) ABSTRACT

An ethylene resin composition is provided which has excellent properties including adhesion properties, electrically insulating properties, transparency, moldability and process stability and can be produced without requiring any cross-linking procedure if necessary to improve productivity; and others. The ethylene resin composition contains a modified product produced by modifying an ethylene polymer (A) that meets all of the requirements a) to e) mentioned below with an ethylenically unsaturated silane compound (B). a) The density is 900 to 940 kg/m³. b) The melting peak temperature is 90 to 125 °C. as determined by DSC. c) The melt flow rate (MFR2) is 0.1 to 100 g/10 minutes as measured at 190 ° C. and a load of 2.16 kg in accordance with JIS K-6721. d) The Mw/Mn ratio is 1.2 to 3.5. e) The content of metal residues is 0.1 to 50 ppm.

18 Claims, 2 Drawing Sheets

(51) Int. Cl.
  *B32B 27/32* (2006.01)
  *C08F 10/02* (2006.01)
  *C08L 23/08* (2006.01)
  *C08L 23/26* (2006.01)
  *C08F 255/02* (2006.01)
  *C08L 51/06* (2006.01)
  *C08K 5/00* (2006.01)
  *C08K 5/5425* (2006.01)

(52) U.S. Cl.
  CPC ........ *H01L 31/0481* (2013.01); *B32B 2457/12* (2013.01); *C08K 5/005* (2013.01); *C08K 5/5425* (2013.01); *Y02E 10/50* (2013.01)
  USPC ........... 428/159; 136/251; 252/288; 252/240; 524/585

(56) References Cited

U.S. PATENT DOCUMENTS

| | | |
|---|---|---|
| 2006/0142490 A1 | 6/2006 | Oi |
| 2009/0069171 A1 | 3/2009 | Sagae |
| 2009/0173384 A1 | 7/2009 | Ool et al. |

FOREIGN PATENT DOCUMENTS

| | | |
|---|---|---|
| JP | 2005-019975 A | 1/2005 |
| JP | 2006-210389 A | 8/2006 |
| JP | 2006-316160 A | 11/2006 |
| JP | 2006-342236 | 12/2006 |
| JP | 2006-342326 A | 12/2006 |
| JP | 2007-048504 A | 2/2007 |
| JP | 2007-150069 A | 6/2007 |
| JP | 2007-150094 A | 6/2007 |
| JP | 2009-010277 A | 1/2009 |
| WO | WO 01/61763 A1 | 8/2001 |

OTHER PUBLICATIONS

International Search Report mailed Aug. 31, 2010 for International Application No. PCT/JP2010/003648.

Heiland, Kirstin et al., "Comparison of Zirconocene and Hafnocene Catalysts for the Polymerization of Ethylene and 1-butene," *Makromol. Chem.*, 193, 601-610, Hüthig & Wepf Verlag, Basel (1992).

F. Masi et al., "Hafnium Based Catalysts for the Polymerization of Olefins," 28 355-377 (1989).

Extended European Search Report dated Oct. 9, 2012, issued in corresponding European Patent Application No. 10783131.5-2109 / 2439239. (6 pages).

Office Action (Notice of the Reasons for Rejection) dated Jul. 22, 2014 issued in corresponding Japanese Patent Application No. 2011-518259. (5 pages).

* cited by examiner

ETHYLENE RESIN COMPOSITION, SEALING MATERIAL FOR SOLAR CELL, AND SOLAR CELL MODULE UTILIZING THE SEALING MATERIAL

TECHNICAL FIELD

The present invention relates to an ethylene resin composition which has good adhesion to glass, a backsheet and a thin-film electrode, and which has good electrical insulation properties, transparency, moldability, long-term storage ability, cushioning properties and process stability. And also the present invention relates to an encapsulant material for solar cells made of the same.

The present invention also relates to an encapsulant sheet for solar cells made of such an ethylene resin composition and to a solar cell module manufactured using the encapsulant material or sheet.

BACKGROUND ART

With growing concerns about global environmental issues and energy issues, solar energy is attracting attention as a clean, sustainable energy, with photovoltaic power generation becoming a focus of attention as a new scheme for electricity supply.

When using solar cells in outdoor environment such as on the roof of a building, they are generally interconnected and encapsulated to form a module. Solar cell modules are broadly classified into two groups: crystalline solar cell modules and thin-film solar cell modules. The crystalline solar module is generally manufactured through, for example, a lamination process in which a protection film for solar cell module (front protective member), an encapsulant sheet for solar cells, crystalline solar cells formed of polycrystalline silicon or mono-crystalline silicon, an encapsulant sheet for solar cells, and another protection film for solar cell module (back protective member) are sequentially stacked and the module is laminated under heating in vacuum condition.

The thin-film solar cell module is generally manufactured through, for example, a lamination process in which thin-film solar cell prepared by forming a ultra-thin (several micrometers) amorphous silicon or crystalline silicon film onto glass or the like, an encapsulant sheet for solar cells, and a protection film for solar cell module (back protective member) are sequentially stacked and the module is laminated under heating in vacuum condition.

Solar cell modules manufactured in this way are weather-resistant and thus are suitable for use in outdoor environment such as on the roof of a building.

Heretofore, ethylene-vinyl acetate (EVA) copolymer has been widely used as the material constituting an encapsulant sheet for solar cells (encapsulant material for solar cells) for the requirements for high transparency and high flexibility (see, e.g., Patent Literature 1). When EVA is used as encapsulant material for solar cells, the material is typically subjected to crosslinking to obtain sufficient heat resistance. Crosslinking treatment, however, takes a relatively long time (0.2 to 2 hr or so) and thus reduces the production rate or productivity of solar cell modules. Moreover, there has been concern that acetic acid gas and other unwanted gas generated by decomposition of EVA may affect the performance of the photovoltaic devices.

One approach to overcome the foregoing problems is to employ an encapsulant material for solar cells which is composed, at least partially, of ethylene/α-olefin copolymer. Also proposed is an encapsulant material for solar cells which contains an ethylene/α-olefin copolymer as a main component (see, e.g., Patent Literature 2). However, Patent Literature 2 fails to disclose any specific guide as to physical properties of ethylene/α-olefin copolymer for achieving preferable encapsulant material properties (e.g., heat resistance, transparency, flexibility, and process stability). A possible reason for this is that the technology disclosed therein presupposes conducting crosslinking treatment and therefore aims to achieve desired physical properties on the condition that the material undergoes crosslinking treatment.

Another disclosed encapsulant material for solar cells contains metallocene linear low-density polyethylene with a specific density range (see Patent Literature 3). Similarly, Patent Literature 3 fails to disclose, except for density, any specific guide as to physical properties for achieving preferable encapsulant material properties. A possible reason for this is that the technology disclosed therein presupposes conducting crosslinking treatment and therefore aims to achieve desired physical properties on the condition that crosslinking is conducted. Moreover, the encapsulant material disclosed by Patent Literature 3 has the drawback of possible reduction in heat resistance and humidity resistance.

CITATION LIST

Patent Literature

[PTL 1] Japanese Patent Application Laid-Open No. 08-283696
[PTL 2] Japanese Patent Application Laid-Open No. 2000-091611
[PTL 3] Japanese Patent Application Laid-Open No. 2007-150069

SUMMARY OF INVENTION

Technical Problem

An object of the present invention is to establish, in light of the foregoing circumstances, a clear guide for achieving (but not necessarily conducting crosslinking treatment) desired properties of an encapsulant material for solar cells made of an ethylene resin composition. More specifically, an object of the present invention is to provide an ethylene resin composition which has excellent properties including adhesion, electrical insulation properties, transparency, moldability, long-term storage stability, cushioning properties and process stability upon production of an encapsulant material for solar cells and which can eliminate the need for crosslinking where necessary for improved productivity, and an encapsulant material for solar cells. Another object of the present invention is to provide an ethylene resin composition which can achieve high heat resistance, humidity resistance and adhesion at the same time. Still another object of the present invention is to provide a solar cell module manufactured using the ethylene resin composition and encapsulant material for solar cells.

Solution to Problem

The inventors conducted extensive studies to overcome the foregoing problems pertinent in the art and as a result developed a new ethylene resin composition containing a modified product which is obtained by modifying ethylene polymer (A) having a specific density range, a specific melting point range, a specific melt flow rate range, a specific molecular weight distribution range and a specific metal residue content range and where necessary ethylene/α-olefin copolymer (C), with ethylenically-unsaturated silane compound (B).

The inventors established that the ethylene resin composition can provide an encapsulant material for solar cells which has good adhesion, electrical insulation properties, transparency, moldability and process stability and which can eliminate the need for crosslinking where necessary for improved productivity. The inventors also established that the combined use of a modified product of ethylene polymer (A) and a modified product of ethylene/α-olefin copolymer (C) may make it possible to attain high heat resistance, high humidity resistance, and high adhesion at the same time. The present invention has been accomplished based on these findings.

Namely, a first aspect of the present invention relates to ethylene resin compositions given below.

[1] An ethylene resin composition including:
a modified product produced by modifying ethylene polymer (A) with ethylenically-unsaturated silane compound (B), the ethylene polymer (A) satisfying all of the following requirements a) to e):
  a) density=900 to 940 kg/m$^3$;
  b) Peak melt temperature as measured by DSC=90° C. to 125° C.;
  c) Melt flow rate (MFR2) as measured in accordance with JIS K-6721 at 190° C. under a load of 2.16 kg=0.1 to 100 g/10 min;
  d) Mw/Mn ratio=1.2 to 3.5; and
  e) Metal residue content=0.1 to 50 ppm.

[2] The ethylene resin composition according to [1] above, further including a modified product produced by modifying ethylene/α-olefin copolymer (C) with the ethylenically-unsaturated silane compound (B).

[3] The ethylene resin composition according to [2] above, wherein the ethylene/α-olefin copolymer (C) satisfies the following requirement f):
  f) density=850 to less than 895 kg/m$^3$.

[4] The ethylene resin composition according to any one of [1] to [3] above, wherein the ethylene resin composition satisfies the following requirement g):
  g) an amount of free silane derived from the ethylenically-unsaturated silane compound (B) remaining in the ethylene resin composition is 5 to 40 wt %.

[5] The ethylene resin composition according to any one of [1] to [4] above, wherein the modified product of the ethylene polymer (A) is produced by melt-extrusion of a mixture of the ethylene polymer (A), the ethylenically-unsaturated silane compound (B), and an organic peroxide.

[6] The ethylene resin composition according to any one of [2] to [4] above, wherein the modified product of the ethylene/α-olefin copolymer (C) is produced by melt-extrusion of a mixture of the ethylene/α-olefin copolymer (C), the ethylenically-unsaturated silane compound (B), and an organic peroxide.

[7] The ethylene resin composition according to [5] or [6] above, wherein the ethylene polymer (A) is in the form of powder.

[8] The ethylene resin composition according to [5] or [6] above, wherein the ethylene polymer (A) is in the form of a mixture of powder and pellet.

[9] The ethylene resin composition according to [5] or [6] above, wherein the mixture is a mixture of a powder of the ethylene polymer (A) and a pellet of the ethylene polymer (A), the powder previously impregnated with the ethylenically-unsaturated silane compound (B) and the organic peroxide.

[10] The ethylene resin composition according to any one of [1] to [9] above, further including at least one additive selected from the group consisting of UV absorber (D), light stabilizer (E), and heat resistance stabilizer (F).

[11] The ethylene resin composition according to any one of [2] to [10] above, wherein an amount of the modified product of the ethylene/α-olefin copolymer (C) is 90 weight parts or less per 100 weight parts of a total amount of the modified product of the ethylene polymer (A) and the modified product of the ethylene/α-olefin copolymer (C).

A second aspect of the present invention relates to encapsulant materials for solar cells made of the ethylene resin composition, and to solar cell modules manufactured using the encapsulant material.

[12] An encapsulant material for solar cells including the ethylene resin composition according to any one of [1] to [11] above.

[13] An encapsulant material for solar cells including a sheet made of the ethylene resin composition according to any one of [1] to [11] above.

[14] The encapsulant material according to [12] or [13] above, wherein at least one side of the encapsulant material is embossed,
porosity P is 10% to 50%, the porosity P being defined as a percentage ratio of total volume $V_H$ to apparent volume $V_A$ of the encapsulant material ($V_H/V_A \times 100$), where the total volume $V_H$ is a total volume of concaved portions per unit area of the encapsulant material, and the apparent volume $V_A$ is obtained by multiplying the unit area by a maximum thickness of the encapsulant material, and
storage modulus (E') at 80° C. is $2.5 \times 10^5$ Pa to $1.5 \times 10^8$ Pa.

[15] The encapsulant material according to any one of [12] to [14] above, wherein the encapsulant material is integrated with a back protective member for solar cell modules.

[16] A solar cell module manufactured using the encapsulant material according to any one of [12] to [15] above.

[17] A thin-film solar cell module manufactured using the encapsulant material according to any one of [12] to [15] above.

[18] A crystalline solar cell module manufactured using the encapsulant material according to any one of [12] to [15] above as an encapsulant material for a backside of the solar cell module.

Advantageous Effects of Invention

The present invention can provide an ethylene resin composition which has good adhesion to glass, a backsheet and a thin-film electrode as well as high electrical insulation properties, transparency, moldability, long-term storage stability, cushioning properties and process stability. And also the ethylene resin composition can eliminate the need for crosslinking where necessary for improved productivity. The present invention can also provide an ethylene resin composition which can achieve high heat resistance, humidity resistance and adhesion at the same time, and encapsulant material for solar cells containing the same.

With the encapsulant material for solar cells according to the present invention, it is possible to provide an economical solar cell module having the foregoing excellent properties. The encapsulant material for solar cells according to the present invention is useful as encapsulant material for solar cells for thin-film solar cell modules, particular as encapsulant material for solar cells used for the backside of crystalline solar cell modules.

DESCRIPTION OF EMBODIMENTS

1. Ethylene Resin Composition

Figure 1:
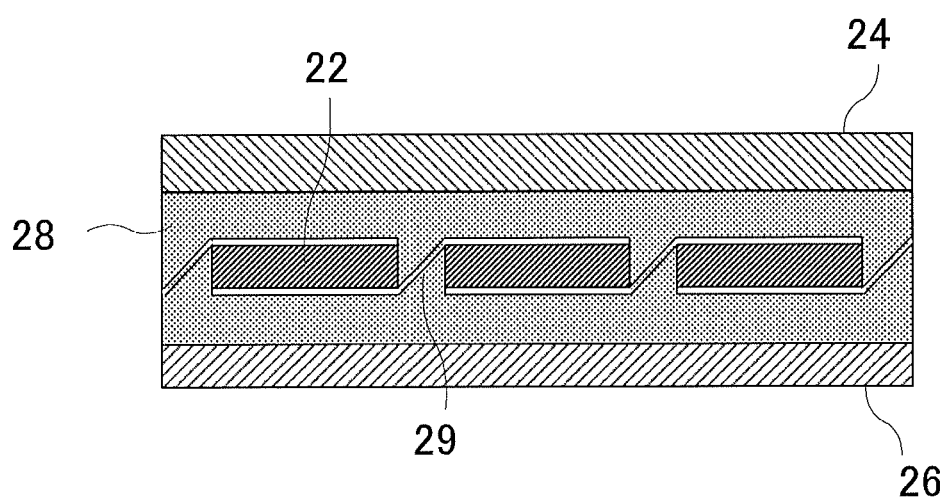
FIG. 1 is a cross-sectional view illustrating an example of a configuration of a crystalline silicon solar cell module.

An ethylene resin composition of the present invention may contain a modified product of ethylene polymer (A) which satisfies the following requirements a) to e) simultaneously, and may further contain a modified product of ethylene-α-olefin copolymer (C) as needed.

Modified Product of Ethylene Polymer (A) and Modified Product of Ethylene/α-Olefin Copolymer (C)

A modified product of ethylene polymer (A) contained in an ethylene resin composition of the present invention is produced by modifying ethylene polymer (A) with ethylenically-unsaturated silane compound (B) under the presence of organic peroxide. A modified product of ethylene/α-olefin copolymer (C) contained in an ethylene resin composition of the present invention is produced by modifying ethylene/α-olefin copolymer (C) with ethylenically-unsaturated silane compound (B) under the presence of organic peroxide.

Ethylene Polymer (A)

There are no particular limitations on ethylene polymer (A) from which a modified product of ethylene polymer (A) is produced as long as it has an ethylene-derived unit and satisfies the requirements a) to e) described later.

Ethylene polymer (A) may be, for example, an ethylene homopolymer or a copolymer of ethylene and α-olefin or cyclic olefin.

The α-olefin in the ethylene/α-olefin copolymer may be a $C_{3-20}$ α-olefin. Examples of $C_{3-20}$ α-olefins include propylene, 1-butene, 1-pentene, 1-hexene, 4-methyl-1-pentene, 1-octene, 1-decene, 1-dodecene, 1-tetradecene, 1-hexadecene, 1-octadecene, and 1-eicosene. Among them, $C_{4-10}$ α-olefins are preferable, with 1-butene, 1-hexene, and 1-octene being most preferable.

Examples of cyclic olefins used for the copolymer of ethylene and cyclic olefin include norbornene derivatives, tricyclo-3-decene derivatives, tricyclo-3-undecene derivatives, tetracyclo-3-dodecene derivatives, pentacyclo-4-pentadecene derivatives, pentacyclo-pentadecadiene derivatives, pentacyclo-3-pentadecene derivatives, pentacyclo-4-hexadecene derivatives, pentacyclo-3-hexadecene derivatives, hexacyclo-4-heptadecene derivatives, heptacyclo-5-eicosene derivatives, heptacyclo-4-eicosene derivatives, heptacyclo-5-heneicosene derivatives, octacyclo-5-docosene derivatives, nonacyclo-5-pentacosene derivatives, nonacyclo-6-hexacosene derivatives, cyclopentadiene-acenaphthylene adduct, 1,4-methano-1,4,4a,9a-tetrahydrofluorene derivatives, 1,4-methano-1,4,4a,5,10,10a-hexahydroanthracene derivative, and $C_{3-20}$ cycloalkylene derivatives.

Among them, tetracyclo[$4.4.0.1^{2,5}.1^{7,10}$]-3-dodecene derivatives, and hexacyclo[$6.6.1.1^{3,6}.1^{10,13}.0^{2,7}.0^{9,14}$]-4-heptadecene derivative are preferable, with tetracyclo [$4.4.0.1^{2,5}.1^{7,10}$]-3-dodecene derivatives being particularly preferable.

These α-olefins and cyclic olefins may be used alone or in combination. These α-olefins and cyclic olefins may form either random copolymers or block copolymers with ethylene.

Ethylene polymer (A) used for the ethylene resin composition of the present invention satisfies the requirements a) to e) given below.

[Requirement a)]

Ethylene polymer (A) has a density of 900 to 940 kg/m³. Ethylene polymer (A) preferably has a density of 900 to 935 kg/m³, more preferably 900 to 930 kg/m³, further preferably 900 to 925 kg/m³, still further preferably 905 to 925 kg/m³, most preferably 905 to 923 kg/m³.

When ethylene polymer (A) has a density of less than 900 kg/m³, the resultant encapsulant material has low heat resistance. In this case, the encapsulant material in a solar cell module softens, and therefore glass, electrodes and other components gradually slip and fall down when the solar cell module is held inclined during photovoltaic power generation. Moreover, there is tendency that sheet blocking occurs, which hinders unrolling of a sheet roll, and that the chill roll and embossing roll become so sticky that controlling of sheet thickness and sheet molding becomes difficult. When ethylene polymer (A) has a density of greater than 940 kg/m³, the encapsulant material has less flexibility, which causes cracking of silicon crystal cells and/or separation of the silver electrode during the lamination process of a solar cell module. Moreover, in this case, since the encapsulant material is hard to melt, the temperature during the lamination process needs to be set higher than 150° C., a general laminator temperature. If being the general laminator temperature of 150° C., the first step (heating by residual heat in vacuum condition) needs to be carried out for a long time.

The density of ethylene polymer (A) depends on the comonomer content, such as α-olefin content. Specifically, the density increases with decreasing comonomer content in ethylene polymer (A) and vice versa. The comonomer content in ethylene polymer (A) is known to be determined by the comonomer/ethylene ratio in the polymerization system (see, e.g., Walter Kaminsky, Makromol. Chem. 193, p. 606 (1992)).

Thus, the density of ethylene polymer (A) can be adjusted by adjusting the comonomer/ethylene ratio.

The density of ethylene polymer (A) can be measured with a density gradient tube method.

[Requirement b)]

The peak melt temperature of ethylene polymer (A) as measured by DSC is 90° C. to 125° C., preferably 90° C. to 120° C., more preferably 90° C. to 115° C.

When ethylene polymer (A) has a peak melt temperature of less than 90° C., the resultant encapsulant material has low heat resistance. In this case, the encapsulant material in a solar cell module softens, and therefore glass and electrodes gradually slip and fall down when the solar cell module is held inclined during photovoltaic power generation. Moreover, in this case, there is tendency that sheet blocks occurs, which makes unrolling difficult, and that the chill roll and embossing roll become so sticky so that controlling of sheet thickness and sheet molding becomes difficult. When ethylene polymer (A) has a peak melt temperature of greater than 125° C., the encapsulant material has less flexibility, which causes cracking of silicon crystal cells and/or separation of the silver electrode during the lamination process of the solar cell module. Moreover, in this case, since the encapsulant material is hard to melt, the temperature during the lamination process needs to be set higher than 150° C., a general laminator temperature. If being the general laminator temperature of 150° C., the first step (heating by residual heat in vacuum condition) needs to be carried out for a long time.

Similarly to density, the peak melt temperature of ethylene polymer (A) depends on the comonomer content, such as α-olefin content. Specifically, the peak melt temperature increases with decreasing comonomer content in ethylene polymer (A) and vice versa. The comonomer content in ethylene polymer (A) is known to be determined by the comonomer/ethylene ratio in the polymerization system (see, e.g., Walter Kaminsky, Makromol. Chem. 193, p. 606 (1992)).

Thus, the peak melt temperature of ethylene polymer (A) can be adjusted by adjusting the comonomer/ethylene ratio.

The peak melt temperature of ethylene polymer (A) can be measured with DSC through the following DSC procedure:

(1) Approximately 5 mg of ethylene polymer (A) is loaded in a DSC aluminum sample pan; (2) the aluminum pan is loaded into a differential scanning calorimeter (PerkinElmer DSC7), the pan is heated from 0° C. to 200° C. at a heating rate of 320° C./min, retained at 200° C. for 5 minutes, cooled from 200° C. to 0° C. at a cooling rate of 10° C./min, retained at 0° C. for 5 minutes, and heated at a heating rate of 10° C./min; and 3) the peak top temperature in the obtained DSC endothermic curve is defined as peak melt temperature.

[Requirement c)]

Ethylene polymer (A) has a melt flow rate (MFR2) of 1 to 100 g/10 min, preferably 0.5 to 50 g/10 min, more preferably 0.5 to 20 g/10 min, as measured in accordance with JIS K-6721 at 190° C. under a load of 2.16 kg.

When ethylene polymer (A) has a melt flow rate (MFR2) of less than 0.1 g/10 min, an ethylene resin composition containing the same becomes less flowable, reducing productivity upon sheet extrusion molding. When ethylene polymer (A) has a melt flow rate (MFR2) of greater than 100 g/10 min, the ethylene resin composition becomes so flowable that sheet molding becomes difficult, and moreover, the sheet has poor mechanical properties, such as poor tensile strength.

The melt flow rate (MFR2) of ethylene polymer (A) largely depends on the molecular weight of ethylene polymer (A). Specifically, there is tendency that the molecular weight of ethylene polymer (A) increases with decreasing melt flow rate (MFR2) and vice versa. The molecular weight of ethylene polymer (A) is known to be determined by the hydrogen/ethylene ratio in the polymerization system (see, e.g., Kazuo Soga, KODANSHA "CATALYTIC OLEFIN POLYMERIZATION" p.376 (1990)). Thus, by adjusting the hydrogen/ethylene ratio, it is possible to produce ethylene polymer (A) that satisfies the requirement (c) specified in the present invention.

The melt flow rate (MFR2) of ethylene polymer (A) can be measured in accordance with JIS K-6721 at 190° C. under a load of 2.16 kg.

[Requirement d)]

The ratio of weight-average molecular weight (Mw) to number-average molecular weight (Mn) of ethylene polymer (A), Mw/Mn ratio, in an ethylene resin composition of the present invention as measured by gel permeation chromatography (GPC) is 1.2 to 3.5, preferably 1.2 to 3.2, more preferably 1.2 to 2.8.

In general, living polymerization is inevitable for obtaining ethylene polymer (A) with a Mw/Mn ratio of less than 1.2. To obtain a living polymer, the amount of catalyst per unit polymer weight has to increase, which is industrially disadvantageous as the polymer production cost increases. When the Mw/Mn ratio of ethylene polymer (A) is greater than 3.5, the resultant ethylene resin composition has low impact strength. Moreover, the resultant sheet become so sticky that blocking occurs, making unrolling of a rolled sheet difficult.

The ratio of weight-average molecular weight (Mw) to number-average molecular weight (Mn), Mw/Mn ratio, is generally influenced by the composition distribution. For example, in a case where ethylene polymer (A) is to be produced by batch slurry polymerization, the Mw/Mn ratio tends to be small at a low comonomer conversion, and tends to be high at a high comonomer conversion. Here, the term "comonomer conversion" refers to the ratio of the comonomer participating in the polymerization reaction to the comonomer charged. By shortening the polymerization time, the comonomer conversion becomes small, whereby degradation of the active species of polymerization catalyst can be suppressed. Accordingly, the composition distribution becomes narrow, and therefore the Mw/Mn ratio tends to become small. On the other hand, by prolonging the polymerization time, the comonomer conversion becomes high so that degradation of the polymerization catalyst occurs. Accordingly, the composition distribution becomes broad, and therefore the Mw/Mn ratio tends to become large. In the case of continuous gas phase polymerization or solution polymerization, by shortening the mean residence time, degradation of the polymerization catalyst is suppressed and therefore the composition distribution becomes narrow, whereby the Mw/Mn ratio tends to be small. On the other hand, when the mean residence time is prolonged, deterioration of the active species of polymerization catalyst occurs and therefore the composition distribution becomes broad, whereby the Mw/Mn ratio tends to become large.

The molecular weight distribution (Mw/Mn) of ethylene polymer (A) can be measured by GPC on Waters Alliance GPC 2000.

[Requirement e)]

The metal residue content in ethylene polymer (A) is 0.1 to 50 ppm, preferably 0.1 to 45 ppm, further preferably 0.1 to 40 ppm, most preferably 5 to 50 ppm.

When the metal residue content in ethylene polymer (A) is less than 0.1 ppm, decalcification of polymerization catalyst is indispensable, which increases plant's fixed costs as well as serve costs leading to increased production costs. Moreover, since a large quantity of acid or base or chelating agent is required for decalcification, it becomes likely that the acid or base or chelating agent remains in ethylene polymer (A). For this reason, when ethylene polymer (A) is used as a raw material of encapsulant material for solar cells, such an acid, base or chelating agent remaining in ethylene polymer (A) may corrode the electrode or other member of a solar cell module. When the metal residue content is less than 0.1 ppm, on the other hand, it results in low long-term storage stability. This may be due to the fact that metal residues serve as an agent for capturing an acid and alkali. Specifically, it is conjectured that when metal residues are scarce, substances responsible for breaking bonds between glass and resin cannot be fully shut out, and therefore, bond breakage often occurs. When Ti Zr, Hf and the like—which are metals generally used in metallocene compounds used as a polymerization catalyst of ethylene polymer (A)—are present in small amount, they activate organic peroxide and thereby increases the grafting efficiency of ethylenically-unsaturated silane compound (B) during the extrusion modification process. Moreover, since these metals activate the organic peroxide present in an infinitesimal amount in an ethylene resin composition during the lamination process, it is conjectured that the graft modification of ethylene polymer with free ethylenically-unsaturated silane compound in the ethylene resin composition can be facilitated, thus an adhesion of the ethylene resin composition is enhanced.

On the other hand, when the metal residue content in ethylene polymer (A) is greater than 50 ppm, metal residues reduce volume resistivity and dielectric breakdown strength. Moreover, when the metal residue content in ethylene polymer (A) is greater than 50 ppm, it results in low long-term storage stability. This is considered to be due to the fact that when ethylene polymer (A) is used as a raw material of encapsulant material for solar cells, metal ions leach into the contact surface between a glass and a encapsulant material of solar cells and break bonds between the glass and the encapsulant material.

The metal residue is derived from, for example, a transition metal of a metallocene compound, which serves as an active species of polymerization catalyst. The quantity of the metal residue depends on the polymerization activity. Specifically, when a polymerization catalyst with a high polymerization activity is used, the amount of catalyst with respect to monomer, and therefore the metal residue content, can be reduced. Thus, the use of a polymerization catalyst with a high polymerization activity is a suitable approach to reduce the metal residue content. Other suitable approaches to reduce the residual metal content by increasing polymerization activity include conducting polymerization at a polymerization temperature optimal for a polymerization catalyst used, and increasing the monomer concentration per unit polymerization catalyst by increasing the polymerization pressure as much as possible. In some embodiments, an organic aluminumoxy compound, a compound that forms ion pairs by reaction with the metallocene compound, an organic aluminum compound or the like is added to the metallocene compound. Reducing the added amount of these compounds as much as possible is also a suitable approach to reduce the metal residue content. In addition, increasing polymerization activity in different ways may also be a suitable approach to reduce the metal residue content.

Alternatively, the metal residue content may be reduced with decalcification by using an acid, an alkali, or a chelating agent such as methyl acetoacetate. However, this decalcification is not suitable for the present invention because when the acid and alkali or chelating agent remains in ethylene polymer (A), they facilitate corrosion of the thin-film electrodes.

The metal residue content in ethylene polymer (A) can be measured through the following procedure:

(1) Ethylene polymer (A) is decomposed by wet process and diluted with pure water to a given final volume; and (2) each of amounts of metal elements is quantified with an ICP emission spectrometer (ICPS-8100, Shimadzu Corporation), with the total amount of the metal elements defined as metal residue content.

Process of Producing Ethylene Polymer (A)

Ethylene polymer (A) used in the present invention can be produced using an ethylene polymerization catalyst component known in the art. For example, Ziegler-Natta catalysts or metallocene compounds can be used. Among them, metallocene compounds, which have a high polymerization activity per unit transition metal, are preferable because ethylene polymer (A) with less metal residues can be obtained without having to perform decalcification treatment. For the metallocene compounds, those described in JP-A Nos.2006-077261, 2008-231265 and 2005-314680 can be used, for example. Metallocene compounds which have different structure than those of the metallocene compounds disclosed in the above Patent Literature can also be used as long as ethylene polymer (A) that satisfies the requirements a) to e) can be obtained. Two or more different metallocene compounds may be blended. A preferable embodiment of a process for producing ethylene polymer (A) using a metallocene compound is, for example, a process in which ethylene is homopolymerized, ethylene and at least one $C_{3-20}$ α-olefin are copolymerized, or ethylene and a cyclic olefin are copolymerized, under the presence of an olefin polymerization catalyst consisting of a metallocene compound (I) known in the art and at least one compound (II) (referred to as a "catalytic promoter" in some cases) selected from the group consisting of an organic aluminumoxy compound (II-1), a compound that forms ion pairs by reaction with the metallocene compound (II-2), and an organic aluminum compound (II-3). For organic aluminumoxy compound (II-1), compound (II-2) that forms ion pairs by reaction with the metallocene compound and organic aluminum compound (II-3), those described in JP-A Nos.2006-077261, 2008-231265 and 2005-314680 can be used. Any compound that differs from those described in these Patent Literatures can be used as long as ethylene polymer (A) that satisfies the above requirements a) to e) can be obtained. These compounds may be individually charged into a polymerization atmosphere or may be previously contacted with one another before being charged into the polymerization atmosphere. The above metallocene compounds and promoters may be loaded on an inorganic oxide microparticle carrier such as that described in JP-A No.2005-314680.

Polymerization

Ethylene polymer (A) can be produced by gas-phase polymerization known in the art or by liquid-phase polymerization such as slurry polymerization or solution polymerization. Polymerization is preferably gas-phase polymerization or slurry polymerization, a polymerization process where polymerization activity is high and less metal residue is produced. Slurry polymerization and solution polymerization are carried out under the presence of an non-reactive carbohydrate medium, such as an aliphatic hydrocarbon such as propane, butane, pentane, hexane, heptane, octane, decane, dodecane, and kerosene; an alicyclic hydrocarbon such as cyclopentane, cyclohexane, and methylcyclopentane; an aromatic hydrocarbon such as benzene, toluene, and xylene; a halogenated hydrocarbon such as ethylenechloride, chlorobenzene, and dichloromethane; or a mixture thereof. Among these non-reactive hydrocarbon solvents, aliphatic hydrocarbons and alicyclic hydrocarbons are preferable.

When using the above metallocene compound to produce ethylene polymer (A) by homopolymerization of ethylene, copolymerization of ethylene and at least one $C_{3-20}$ α-olefin, or copolymerization of ethylene and a cyclic olefin, the metallocene compound (I) is used in an amount of $10^{-9}$ to $10^{-1}$ mol, preferably $10^{-8}$ to $10^{-2}$ mol, per 1 L reaction volume. When the amount of the metallocene compound (I) is less than $10^{-9}$ mol/L, the polymerization reaction takes place less frequently resulting in unwanted reduction in polymerization activity. When the amount of the metallocene compound (I) is greater than $10^{-1}$ mol/L, it results in unwanted increase in the metal residue content in ethylene polymer (A). The compound (II-1) is used in an amount such that the mole ratio of the compound (II-1) to total metal atoms (M) in metallocene compound (I), [(II-1)/M], ranges from 1 to 10,000, more preferably 1 to 5,000. The compound (II-2) is used in an amount such that the mole ratio of the compound (II-2) to total metal atoms (M) in metallocene compound (I), [(II-2)/M], ranges from 0.5 to 50, more preferably 1 to 20. The compound (II-3) is used in an amount of 0 to 5 mmol, preferably about 0 to 2 mmol, per 1 L polymerization reaction volume.

When ethylene polymer (A) used in the present invention is to be produced by "solution polymerization," polymerization temperature is 0° C. to 200° C., 20° C. to 190° C., more preferably 40° C. to 180° C. In a solution polymerization process according to the present invention, polymerization temperature of less than 0° C. is not practical in terms of productivity, because at such a temperature level polymerization activity remarkably drops. In the polymerization temperature region of 0° C. or higher, solution's viscosity during polymerization decreases with increasing temperature, and removal of polymerization heat is facilitated. However, when the polymerization temperature exceeds 200° C., it results in remarkable reduction in polymerization activity, and therefore, the polymerization process becomes less practical in terms of productivity. Polymerization pressure is from normal pressure to 10 MPa (gauge pressure), preferably from normal pressure to 8 MPa (gauge pressure). Polymerization can be carried out in a batchwise, semi-continuous or continuous process. Reaction time (average residence time in cases where polymerization is carried out in a continuous process) varies depending on the reaction condition such as catalyst concentration or polymerization temperature, and can be determined according to the intended purpose; reaction time is 1 minute to 3 hours, preferably 10 minutes to 2.5 hours. Polymerization can also be carried out in two or more stages of different reaction conditions. The molecular weight of ethylene polymer (A) to be produced can also be adjusted by changing the hydrogen concentration in the polymerization system and/or polymerization temperature within the scope of the present invention. Further, the molecular weight of ethylene polymer (A) can be adjusted by changing the amount of the compound (II) used. When hydrogen is to be added, an appropriate added amount is about 0.001 NL to about 5,000 NL per 1 Kg of ethylene/α-olefin copolymer. Optionally, ethylene polymer (A) produced by the above polymerization process is subjected to decalcification treatment known in the art used for the production of olefin polymer, for removal of catalyst components and inorganic oxide microparticle carrier.

Ethylenically-unsaturated Silane Compound (B)

There are no particular limitations on ethylenically-unsaturated silane compound (B) used in the present invention; known ethylenically-unsaturated silane compounds can be used. Specific examples include vinyltriethoxysilane, vinyltrimethoxysilane, vinyltris(β-methoxy-ethoxysilane), γ-glycidoxypropyltrimethoxysilane, γ-aminopropyltriethoxysilane, γ-methacryloxypropyltrimethoxysilane, 2-(3,4-epoxycyclohexyl)ethyltrimethoxysilane, 3-glycidoxypropyltrimetoxysilane, 3-glycidoxypropylmethylethoxysilane, p-styryltrimethoxysilane, 3-methacryloxypropylmethyldimethoxysilane, 3-methacryloxypropylmethyldiethoxysilane, 3-methacryloxypropyltriethoxysilane, 3-acryloxypropyltrimethoxysilane, N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-triethoxysilyl-N-(1,3-dimethyl-butylidene)propylamine, N-phenyl-3-aminopropyltrimethoxysilane, 3-ureidopropyltriethoxysilane, and 3-isocyanatepropyl triethoxysilane. Among them, γ-glycidoxypropyltrimetoxysilane, γ-aminopropyltriethoxysilane, γ-methacryloxypropyltrimethoxysilane, vinyltriethoxysilane, vinyltrimethoxysilane, 3-acryloxypropyltrimethoxysilane, etc., which provide the ethylene resin composition with high adhesion, are preferred.

Vinyltriethoxysilane, vinyltrimethoxysilane, and 3-acryloxypropyltrimethoxysilane are more preferable. This is because the resultant ethylene resin composition has good adhesion and thus can shorten the time in which the module is laminated, and that they have less steric hindrance and therefore the grafting efficiency of ethylene polymer (A) is high.

The compounding amount of ethylenically-unsaturated silane compound (B) is 0.1 to 5 weight parts, preferably 0.1 to 4 weight parts, more preferably 0.3 to 4 weight parts, further preferably 0.3 to 2.5 weight parts, most preferably 0.5 to 2.5 weight parts, per 100 weight parts of ethylene polymer (A) or 100 weight parts of the total amount of ethylene polymer (A) and ethylene/α-olefin copolymer (C) later described.

When the compounding amount of ethylenically-unsaturated silane compound (B) falls within the above ranges, there are no adverse effects on properties (e.g., transparency and flexibility) of the resultant ethylene resin composition while fully enhancing the composition's adhesion.

Ethylene/α-olefin Copolymer (C)

Ethylene/α-olefin copolymer (C) from which a modified product of ethylene/α-olefin copolymer (C) is produced can be prepared by copolymerization of ethylene and one or more different $C_{3-20}$ α-olefins.

Examples of $C_{3-20}$ α-olefins include straight- or branched-chain α-olefins, such as propylene, 1-butene, 2-butene, 1-pentene, 3-methyl-1-butene, 1-hexene, 4-methyl-1-pentene, 3-methyl-1-pentene, 1-octene, 1-decene, and 1-dodecene. Examples of α-olefins usable in the present invention include polar group-containing olefins. Examples of polar group-containing olefins include α,β-unsaturated carboxylic acids such as acrylic acid, methacrylic acid, fumaric acid and maleic anhydride, and metal salts (e.g., sodium salts) thereof; α,β-unsaturated carboxylic acid esters such as methyl acrylate, ethyl acrylate, n-propyl acrylate, methyl methacrylate, and ethyl methacrylate; vinyl esters such as vinyl acetate, and vinyl propionate; and unsaturated glycidyls such as methaglycidyl acrylate and glycidyl methacrylate. Polymerization can also be carried out under the coexistence of vinylcyclohexane, diene or polyene; an aromatic vinyl compound such as styrene, including o-methylstyrene, m-methylstyrene, p-methylstyrene, o,p-dimethylstyrene, methoxy styrene, and vinylbenzoic acid, vinylmethyl benzoate or vinylbenzyl acetate, hydroxystyrene, p-chlorostyrene, or divinylbenzene; or 3-phenylpropylene, 4-phenylpropylene or α-methylstyrene.

The $C_{3-20}$ α-olefins are preferably α-olefins having 4 or more carbon atoms. Most preferable are $C_{4-8}$ α-olefins. Examples of such α-olefins include 1-butene, 1-pentene, 1-hexene, 3-methyl-1-butene, 3,3-dimethyl-1-butene, 4-methyl-1-pentene, and 1-octene, and can be used alone or in combination. Among them, 1-butene, 1-pentene, 1-hexene, 4-methyl-1-pentene, and 1-octene are preferable in view of their availability and physical properties of a copolymer to be produced. Further, in the present invention, $C_{3-20}$ cyclic olefins such as cyclopentene, cycloheptene, norbornene, 5-methyl-2-norbornene, 5-ethylidene-2-norbornene, and 5-vinyl-2-norbornene may be used in combination.

It is advantageous that the comonomer in ethylene polymer (A) is not identical to the comonomer in ethylene/α-olefin copolymer (C). This is because when the two comonomers are identical, the compatibility between ethylene polymer (A) and ethylene/α-olefin copolymer (C) increases, and therefore the resultant ethylene resin composition tends to have low heat resistance. It should be noted, however, that the comonomer in ethylene polymer (A) may be identical to the comonomer in ethylene/α-olefin copolymer (C) as long as the resultant ethylene resin composition has satisfactory heat resistance. Ethylene/α-olefin copolymer (C) may be either a random copolymer or a block copolymer.

The α-olefin-derived unit content in ethylene/α-olefin copolymer (C) is 9 to 22 mol %, preferably 10 to 22 mol %, more preferably 11 to 17 mol %. When the α-olefin-derived unit content in ethylene/α-olefin copolymer (C) is less than 9 mol %, there is tendency that tackiness cannot be increased, failing to increase adhesion. When the α-olefin-derived unit content in ethylene/α-olefin copolymer (C) is greater than 22 mol %, the compatibility of ethylene/α-olefin copolymer (C) with ethylene polymer (A) decreases, and therefore bleed out occurs on the sheet surface, which makes unrolling of a rolled sheet difficult. Moreover, the chill roll and embossing roll become sticky during sheet molding, so that controlling of sheet thickness and sheet molding may become difficult.

Ethylene/α-olefin copolymer (C) has a density of 850 to less than 893 kg/m³, preferably 850 to 890 kg/m³, more preferably 850 to 880 kg/m³. When the density of ethylene/α-olefin copolymer (C) is greater than 895 kg/m³, tackiness and, therefore, adhesion cannot be increased, and no flexibility is imparted. When the density of ethylene/α-olefin copolymer (C) is less than 850 kg/m³, its compatibility with ethylene polymer (A) decreases, and therefore bleed out occurs on the sheet surface, which makes unrolling of a rolled sheet difficult. Moreover, the chill roll and embossing roll become sticky during sheet molding, so that controlling of sheet thickness and sheet molding may also become difficult. The net result of the above is that when the density of ethylene/α-olefin copolymer (C) is set to 850 kg/m³ to less than 895 kg/m³, ethylene/α-olefin copolymer (C) is less compatible with ethylene polymer (A), and therefore, heat resistance of the resultant ethylene resin composition can be ensured without causing reduction in the crystallinity of ethylene polymer (A). Moreover, controlling of sheet thickness and sheet molding are made possible without causing difficulty in unrolling sheet rolls or making the chill roll and embossing roll sticky during sheet molding.

The peak melt temperature of ethylene/α-olefin copolymer (C) as measured by DSC is 85° C. or less or in a substantially unmeasurable range, preferably 80° C. or less or in a substantially unmeasurable range, more preferably 75° C. or less or in a substantially unmeasurable range. When the peak melt temperature of ethylene/α-olefin copolymer (C) is greater than 85° C., there is tendency that tackiness as well as adhesion does not increase.

The melt flow rate (MFR2) of ethylene/α-olefin copolymer (C), as measured in accordance with JIS K-6721 at 190° C. under a load of 2.16 kg, is 0.1 to 100 g/10 min, preferably 0.1 to 80 g/10 min, more preferably 0.5 to 80 g/10 min, further preferably 1.0 to 50 g/10 min.

When the melt flow rate (MFR2) of ethylene/α-olefin copolymer (C) is less than 0.1 g/10 min, an ethylene resin composition containing ethylene/α-olefin copolymer (C) becomes less flowable, resulting in low sheet molding productivity. Moreover, scorch of the resin composition becomes more likely to take place ("scorch" means premature crosslinking of a resin composition during processing), thus facilitating gellation. This may increase the extruder' torque, which makes difficult sheet molding. Even when a sheet is obtained, gels generated in the extruder may create irregularities on the sheet surface which deteriorate appearance. Moreover, application of voltage cause cracks around gels inside the sheet, reducing dielectric breakdown strength. Further, moisture permeation becomes likely to occur at the gel interface, reducing moisture permeability. Irregularities on the sheet surface reduces its adhesion to glass, a thin-film electrode and a backsheet during the lamination process of a solar cell module, resulting in poor adhesion between the components. On the other hand, when the melt flow rate (MFR2) of ethylene/α-olefin copolymer (C) is greater than 100 g/10 min, the resin composition sticks to the surface of the chill roll or other member due to low molecular weight, making it difficult to form a uniform thick sheet due to the necessity of removing the attached material. Moreover, since the resin composition is not chewy, it tends to be difficult to form a thick sheet with a thickness of 0.3 mm or more.

The ratio of MFR10 (melt flow rate as measured in accordance with JIS K-6721 at 190° C. under a load of 10 kg) to MFR2 of ethylene/α-olefin copolymer (C), MFR10/MFR2, is 5.0 to 8.0. The MFR10/MFR2 ratio is preferably 5.5 to 8.0, more preferably 5.5 to 7.5. When the MFR10/MFR2 ratio is less than 5.0, production of ethylene/α-olefin copolymer (C) becomes difficult. When the MFR10/MFR2 ratio is greater than 8.0, there is tendency that the resin composition has poor low-temperature characteristics.

The ratio of weight-average molecular weight (Mw) to number-average molecular weight (Mn) of ethylene/α-olefin copolymer (C) as measured by gel permeation chromatography (GPC), i.e., molecular weight distribution Mw/Mn, is 1.2 to 3.5, preferably 1.5 to 3.5, more preferably 1.7 to 3.2. Production of ethylene/α-olefin copolymer (C) with an Mw/Mn ratio of less than 1.2 requires living polymerization of ethylene and α-olefin. Alternatively, for achieving Mw/Mn ratio of less than 1.2, ethylene/α-olefin copolymer prepared with a conventional polymerization process with a low catalytic activity has to be purified for removing both of low-molecular weight oligomers and high-molecular weight oligomers, which increases production costs. Moreover, since a moldable temperature range becomes narrow and since the discharge amount from an extruder becomes non-uniform, it becomes difficult to produce a uniform thick sheet.

When the Mw/Mn ratio of ethylene/α-olefin copolymer (C) is greater than 3.5, low-molecular oligomers occur. These components make the resultant sheet sticky, causing sheet blocking and hindering unrolling of a rolled sheet. It is generally known that the composition distribution becomes broad with increasing Mw/Mn ratio, making the sheet sticky. This causes blocking of the sheet and hindering unrolling of the sheet roll. Moreover, since the low-molecular weight oligomers ooze on the sheet surface, they hinder adhesion and cause adhesion reduction.

The compounding amount of ethylene/α-olefin copolymer (C) is such that the ratio of ethylene polymer (A) to ethylene/α-olefin copolymer (C) is 100/0 to 10/90 (weight ratio), preferably 100/0 to 20/80 (weight ratio), more preferably 100/0 to 40/60 (weight ratio), still more preferably 100/0 to 60/40 (weight ratio).

When the weight ratio of ethylene/α-olefin copolymer (C) with respect to ethylene polymer (A) is greater than 90/10, the resultant encapsulant material has low heat resistance. For this reason, when a solar cell module is held inclined during photovoltaic power generation, there is tendency that glass, electrodes and other components gradually slip and fall down, and that the chill roll and embossing roll become so sticky that controlling of sheet thickness and sheet molding becomes difficult. Moreover, sheet blocking occurs, which makes unrolling of a rolled sheet difficult. By blending ethylene/α-olefin copolymer (C) in such an amount falling within the above range, the resultant ethylene resin composition has improved tackiness, and therefore, the encapsulant material tends to have improved adhesion to adherends, the adherends are typically back protective components for solar cell modules, such as polyester plates, steel plates, plastic plates, and FRP plates.

Process for Producing Ethylene/α-Olefin Copolymer (C)

There are no particular limitations on the process of producing ethylene/α-olefin copolymer (C); ethylene/α-olefin copolymer (C) can be produced using a variety of catalysts, such as titanium compounds, vanadium compounds, or metallocene compounds. It is preferable to employ metallocene compounds with which an ethylene/α-olefin copolymer having a Mw/Mn ratio and composition distribution that satisfies the above-described conditions can be readily obtained. For the metallocene compounds, those described in JP-A Nos. 2006-077261, 2008-231265 and 2005-314680 can be used, for example. Metallocene compounds which have different structure than those of the metallocene compounds disclosed in the above Patent Literature can also be used as long as ethylene polymer (A) that satisfies the requirements a) to e) can be obtained. Two or more different metallocene compounds may be combined. A preferable embodiment of a process for producing ethylene/α-olefin copolymer (C) is, for example, a process in which ethylene is copolymerized with one or more $C_{3-20}$ α-olefins under the presence of an olefin polymerization catalyst consisting of a metallocene compound (I) known in the art and at least one compound (II) selected from the group consisting of an organic aluminumoxy compound (II-1), a compound (II-2) that forms ion pairs by reaction with the metallocene compound, and an organic aluminum compound (II-3) (referred to as a "promoter" in some cases). For the organic aluminumoxy compound (II-1), compound (II-2) that forms ion pairs by reaction with the metallocene compound and organic aluminum compound (II-3), those for the production of ethylene polymer (A) described above can be used. The above metallocene compounds and promoters may be loaded on an inorganic oxide microparticle carrier such as that described in JP-A No. 2005-314680.

Polymerization

Ethylene/α-olefin copolymer (C) can be produced by conventional gas-phase polymerization or by conventional liquid-phase polymerization such as slurry polymerization or solution polymerization. Ethylene/α-olefin copolymer (C) is preferably produced by liquid-phase polymerization such as solution polymerization.

When using the above metallocene compound to produce ethylene/α-olefin copolymer (C) by copolymerization of ethylene and a $C_{3-20}$ α-olefin, the metallocene compound (I) is used in an amount of $10^{-9}$ to $10^{-1}$ mol, preferably $10^{-8}$ to $10^{-2}$ mol, per 1 L reaction volume.

The compound (II-1) is used in an amount such that the mole ratio of the compound (II-1) to total metal atoms (M) in metallocene compound (I), [(II-1)/M], is 1 to 10,000, more preferably 1 to 5,000. The compound (II-2) is used in an amount such that the mole ratio of the compound (II-2) to total metal atoms (M) in metallocene compound (I), [(II-2)/M], is 0.5 to 50, more preferably 1 to 20. The compound (II-3) is used in an amount of 0 to 5 mmol, preferably 0 to 2 mmol, per 1 L polymerization reaction volume.

In the case of solution polymerization, ethylene/α-olefin copolymer (C) with high comonomer content, a narrow composition distribution and a narrow molecular weight distribution can be efficiently produced by copolymerization of ethylene with a $C_{3-20}$ α-olefin under the presence of the above metallocene compound. As to the charging ratio of ethylene to $C_{3-20}$ α-olefin (by mole), ethylene/α-olefin is 10/90 to 99.9/0.1, preferably 30/70 to 99.9/0.1, more preferably 50/50 to 99.9/0.1.

Examples of $C_{3-20}$ α-olefins include straight- or branched-chain α-olefins, such as, propylene, 1-butene, 2-butene, 1-pentene, 3-methyl-1-butene, 1-hexene, 4-methyl-1-pentene, 3-methyl-1-pentene, 1-octene, 1-decene, and 1-dodecene. And also, examples of α-olefins usable in the present invention include polar group-containing olefins.

Examples of polar group-containing olefins include α,β-unsaturated carboxylic acids such as acrylic acid, methacrylic acid, fumaric acid and maleic anhydride, and metal salts (e.g., sodium salts) thereof; α,β-unsaturated carboxylic acid esters such as methyl acrylate, ethyl acrylate, n-propyl acrylate, methyl methacrylate, and ethyl methacrylate; vinyl esters such as vinyl acetate, and vinyl propionate; and unsaturated glycidyls such as methaglycidyl acrylate and glycidyl methacrylate. High-temperature solution polymerization can also be proceeded under the coexistence of vinylcyclohexane, diene or polyene; an aromatic vinyl compound such as styrene derivatives, styrene, o-methylstyrene, m-methylstyrene, p-methylstyrene, o,p-dimethylstyrene, methoxy styrene, vinylbenzoic acid, vinylmethyl benzoate, vinylbenzyl acetate, hydroxystyrene, p-chlorostyrene, or divinylbenzene, 3-phenylpropylene, 4-phenylpropylene or α-methylstyrene.

Among these α-olefins, 1-butene, 1-hexene, 4-methyl-1-pentene, and 1-octene are preferred. In a solution polymerization process in the present invention, $C_{3-20}$ cyclic olefins such as cyclopentene, cycloheptene, norbornene, 5-methyl-2-norbornene, 5-ethylidene-2-norbornene, and 5-vinyl-2-norbornene may be used in combination.

"Solution polymerization" according to the present invention is a generic term used to refer to a method of polymerization in which a monomer is dissolved in a non-reactive carbohydrate solvent later described. Polymerization temperature of the solution polymerization according to the present invention is 0° C. to 200° C., preferably 20° C. to 190° C., more preferably 40° C. to 180° C.

In a solution polymerization process according to the present invention, polymerization temperature of less than 0° C. is not practical in terms of productivity, because at such a temperature level not only polymerization activity remarkably drops, but also the number of double bonds at the terminal of molecules of ethylene/α-olefin copolymer (C) decreases. In the polymerization temperature region of 0° C. or higher, solution's viscosity during polymerization decreases with increasing temperature, and removal of polymerization heat is facilitated. Moreover, the number of double bonds at the terminal of molecules of ethylene/α-olefin copolymer (C) increases. However, when the polymerization temperature exceeds 200° C., it results in remarkable reduction in polymerization activity, and therefore, the polymerization process becomes less practical in terms of productivity.

Polymerization pressure is from normal pressure to 10 MPa (gauge pressure), preferably from normal pressure to 8 MPa (gauge pressure). Polymerization can be carried out in a batchwise, semi-continuous or continuous process. Reaction time (average residence time in cases where polymerization is carried out in a continuous process) varies depending on the reaction condition such as catalyst concentration or polymerization temperature, and can be determined according to the intended purpose; reaction time is 1 minute to 3 hours, preferably 10 minutes to 2.5 hours. Polymerization can also be carried out in two or more stages with different reaction conditions.

The molecular weight of ethylene/α-olefin copolymer (C) to be produced can also be adjusted by changing the hydrogen concentration in the polymerization system and/or polymerization temperature within the scope of the present invention. Further, the molecular weight of ethylene/α-olefin copolymer (C) can be adjusted by changing the amount of the compound (II) used. When hydrogen is to be added, an appropriate added amount is about 0.001 to about 5,000 NL per 1 Kg of ethylene/α-olefin copolymer (C) to be produced. The number of vinyl and vinylidene groups present at the terminal of molecules of ethylene/α-olefin copolymer (C) to be produced can be adjusted by increasing polymerization temperature or reducing the added amount of hydrogen as much as possible.

In a case of producing ethylene/α-olefin copolymer (C) by coordination polymerization (see Examples later described), long-chain branches in ethylene/α-olefin copolymer (C) can be generated through re-insertion of vinyl-terminated chain molecule as "macromonomer" into the ethylene/α-olefin copolymer chain, the macro-monomer being produced by the β-hydrogen elimination reaction during polymerization.

Thus, by increasing or reducing the ratio of macromonomer concentration to ethylene concentration ([macromonomer]/[ethylene]) in the solution, it is possible to control the MFR10/MFR2 ratio of ethylene/α-olefin copolymer (C). In general, the number of long-chain branches in an ethylene/α-olefin copolymer increases with increasing [macromonomer]/[ethylene] ratio, and vise versa.

Specific approaches to increase or reduce the [macromonomer]/[ethylene] ratio in the solution include adjusting the following parameters:

[1] Polymerization Temperature

The lower the polymerization temperature, the less likely that β-hydrogen elimination reaction takes place. Thus, by lowering the polymerization temperature, the [macromonomer]/[ethylene] ratio becomes small; consequently, the MFR10/MFR2 ratio of the ethylene/α-olefin copolymer decreases.

[2] Polymer Concentration

By lowering the polymer concentration, the relative macromonomer concentration decreases, so that the [macromonomer]/[ethylene] ratio becomes small; consequently, the MFR10/MFR2 ratio of the ethylene/α-olefin copolymer decreases.

[3] Ethylene Conversion

By lowering the ethylene conversion, the ethylene concentration in the solution increases, so that the [macromonomer]/[ethylene] ratio becomes small; consequently, the MFR10/MFR2 ratio of the ethylene/α-olefin copolymer decreases.

[4] Type of Solvent

By employing a high-boiling point solvent for polymerization, it results in high ethylene concentration in the solution, so that the [macromonomer]/[ethylene] ratio becomes small; consequently, the MFR10/MFR2 ratio of the ethylene/α-olefin copolymer decreases.

In addition to or in place of controlling the β-hydrogen elimination reaction, chain transfer to Al atoms, for example, may be increased or reduced to change the MFR10/MFR2 ratio of the ethylene/α-olefin copolymer.

Solvents used for solution polymerization according to the present invention are generally non-reactive hydrocarbon solvents, preferably saturated hydrocarbons with boiling points of 50° C. to 200° C. under normal pressure. Specific examples include alicyclic hydrocarbons such as pentane, hexane, heptane, octane, decane, dodecane, and kerosene; and aliphatic hydrocarbons such as cyclopentane, cyclohexane, and methylcyclopentane. It should be noted that aromatic hydrocarbons such as benzene, toluene, and xylene; and halogenated hydrocarbons such as ethylenechloride, chlorobenzene, and dichloromethane are also included in "non-reaction hydrocarbon solvents" used for high-temperature solution polymerization according to the present invention; there is no limitation on the use thereof. As described above, in a solution polymerization according to the present invention, not only hydrocarbon-soluble organic aluminumoxy compounds often used in the art, but also modified methylaluminoxanes like MMAO and TMAO-341 (both available from Tosoh Finechem Corporation), which are soluble in aliphatic hydrocarbons and alicyclic hydrocarbons, can be used. As a consequence, it is made possible to almost completely avoid possible mixing of aromatic hydrocarbons into the polymerization system or ethylene/α-olefin copolymer. In other words, the solution polymerization process according to the present invention can reduce environmental loads as well as minimize possible adverse effects on the human body.

To suppress variation in physical properties, ethylene/α-olefin copolymer (C) produced by polymerization and other optional additives are preferably melted, kneaded and granulated with any desired method.

The total density of the resin component after blending ethylene polymer (A) with ethylene/α-olefin copolymer (C) is preferably 855 to 940 kg/m$^3$, more preferably 870 to 940 kg/m$^3$, further preferably 870 to 930 kg/m$^3$, most preferably 880 to 920 kg/m$^3$. When the total density of the resin component after blending ethylene polymer (A) with ethylene/α-olefin copolymer (C) is less than 855 kg/m$^3$, there is tendency that the chill roll and emboss roll become sticky during sheet molding, making controlling of sheet thickness and sheet molding difficult. Moreover, there is tendency that blocking of the sheet occurs, which hinders unrolling of the sheet roll. On the other hand, when the total density of the resin component after blending ethylene polymer (A) with ethylene/α-olefin copolymer (C) is greater than 940 kg/m$^3$, the resultant encapsulant material becomes less flexible and thus it becomes likely that cracking of crystalline cells and/or separation of the silver electrode occur. Moreover, there is a need to increase the temperature during the lamination process.

Organic Peroxides

Organic peroxides used in the present invention serve as a radical initiator when ethylene polymer (A) and where necessary ethylene/α-olefin copolymer (C) are to be graft-modified with ethylenically-unsaturated silane compound (B).

By graft-modifying ethylene polymer (A) or ethylene/α-olefin copolymer (C) with ethylenically-unsaturated silane compound (B), it is possible to produce a silane-modified product of ethylene polymer (A) or ethylene/α-olefin copolymer (C). The silane-modified product can provide strong adhesion.

There are no particular limitation on organic peroxides suitably used in the present invention as long as they are capable of graft-modifying ethylene polymer (A) or ethylene/α-olefin copolymer (C) with ethylenically-unsaturated silane compound (B). Specific examples of preferable organic peroxides include dilauroyl peroxide, 1,1,3,3-tetramethyl butylperoxy-2-ethylhexanoate, dibenzoyl peroxide, cyclohexanone peroxide, di-t-butyl terephthalate, cumene hydroperoxide, t-butyl hydroperoxide, 2,5-dimethyl-2,5-di(t-butylperoxy)hexene, 2,5-dimethyl-2,5-di(t-butylperoxy)hexane, t-amylperoxy 2-ethylhexanoate, t-butylperoxy-2-ethylhexanoate, t-butylperoxy isobutyrate, t-butylperoxy maleate, 1,1-di(t-amylperoxy)-3,3,5-trimethylcyclohexane, 1,1-di(t-amylperoxy)cyclohexane, t-amylperoxy isononanoate, t-amylperoxy-n-octoate, 1,1-di(t-butylperoxy)-3,3,5-trimethylcyclohexane, 1,1-di(t-butylperoxy)cyclohexane, t-butylperoxyisopropylcarbonate, t-butylperoxy-2-ethylhexyl carbonate, 2,5-dimethyl-2,5-di(benzoylperoxy)hexane, t-amyl-peroxy benzoate, t-butylperoxy acetate, t-butylperoxyiso nonanoate, t-butylperoxy benzoate, 2,2-di(butylperoxy)butane, n-butyl-4,4-d i(t-butylperoxy)butyrate, methyl ethyl ketone peroxide, ethyl 3,3-di(t-butylperoxy)butyrate, dicumyl peroxide, t-butyl cumyl peroxide, t-butylperoxy benzoate, di-t-butyl peroxide, 1,1,3,3-tetramethylbutyl-hydroperoxide, and acetylacetone peroxide. Preferred examples include 2,5-dimethyl-2,5-di(t-butylperoxy)hexene, 2,5-dimethyl-2,5-di(t-butylperoxy)hexane, t-butylperoxy-2-ethylhexyl carbonate, and t-butylperoxy benzoate.

The compounding amount of the organic peroxide is 0 to 1.0 weight part per 100 weight parts of ethylene polymer (A) or to 100 weight parts of the total amount of ethylene polymer (A) and ethylene/α-olefin copolymer (C), preferably 0.01 to 0.5 weight parts. When the compounding amount of the organic peroxide is within the range, it is possible to prevent a possible increase in the gel fraction of the silane-modified product of ethylene polymer (A) produced. A high gel fraction results in irregularities on the surface of the resultant sheet or the like, which deteriorates appearance. Moreover, application of voltage cause cracks around gels inside the sheet or the like, reducing its dielectric breakdown resistance. Further, when the gel fraction increases, moisture permeation becomes likely to occur at the interface between the gel portion and the non-gel portion, which cause reducing non-moisture permeability.

Process for Producing Modified Product of Ethylene Polymer (A) and Modified Product of Ethylene/α-Olefin Copolymer (C)

As a process for producing a modified product of ethylene polymer (A) or ethylene/α-olefin copolymer (C) with ethylenically-unsaturated silane compound (B), a conventional modification method known in the art such as melt extrusion modification or solution modification can be employed. Melt extrusion modification is preferable in view of its low production costs.

Examples of melt extrusion modification processes used in the present invention include:

(i) Melt-extrusion of ethylene polymer (A) powder and ethylenically-unsaturated silane compound (B) under the presence of an organic peroxide so as to modify ethylene polymer (A) with ethylenically-unsaturated silane compound (B);

(ii) Melt-extrusion of ethylene polymer (A) powder, ethylene polymer (A) pellet and ethylenically-unsaturated silane compound (B) under the presence of an organic peroxide so as to modify ethylene polymer (A) with ethylenically-unsaturated silane compound (B); and (iii) Melt-extrusion of a mixture of ethylene polymer (A) powder, which has been impregnated with ethylenically-unsaturated silane compound (B) and an organic peroxide, with ethylene polymer (A) pellet so as to modify ethylene polymer (A) with ethylenically-unsaturated silane compound (B). In the above melt extrusion modification methods (i) to (iii), ethylene/α-olefin copolymer (c) may be blended into ethylene polymer (A) as needed.

In the methods (i) and (ii) above, the weight ratio of ethylene polymer (A) powder to ethylene polymer (A) pellet, powder/pellet ratio, is 100/0 to 1/99, preferably 100/0 to 5/95, more preferably 100/0 to 20/80.

In the present invention, ethylene polymer (A) powder refers to ethylene polymer (A) in the form of powder with a particle size of about 20 μm to about 5 mm, preferably 0.05 to 4 mm, as measured with, for example, optical microscopic observation or laser diffraction scattering. When the particle size is less than 20 μm, there is tendency that blocking of resin particles is more likely to occur in an extrusion hopper, and therefore the resin material is less kneaded by an extruder screw to cause variation in sheet thickness. When the particle size is greater than 5 mm, there is tendency that the shape of polymerized particles remains on the sheet to cause irregularities on the sheet surface or thickness variation.

In the present invention, the shape of ethylene polymer (A) pellet is adjusted using a known single-screw extruder or twin-screw extruder, for example. Such a pellet includes a round-shaped pellet and a prism-shaped pellet. Pellet size depends on the size of the extruder's hopper inlet; when using a general-purpose extruder, the maximum diameter is preferably 5 cm or less. When the pellet's maximum diameter is greater than 5 cm, there is tendency that pellet shape remains on the sheet to cause irregularities on the sheet surface or thickness variation.

When melt extrusion modification of the ethylene polymer (A) powder is carried out, liquid components like the organic peroxide and ethylenically-unsaturated silane compound (B) to be blended readily permeate the powder. This suitably prevents possible concentration variation in an ethylene resin composition or in encapsulant material or encapsulant sheet for solar cells containing the ethylene resin composition. Moreover, the components are uniformly dispersed upon extrusion. Accordingly, it is possible to prevent the generation of gels in an ethylene resin composition or in encapsulant material or encapsulant sheet for solar cells containing the ethylene resin composition, thereby improving adhesion and increasing breakdown voltage. By allowing ethylenically-unsaturated silane compound (B) to permeate ethylene polymer (A) powder, it is possible to increase the compatibility between ethylene polymer (A) powder and pellet. Therefore, an effect achieved by using ethylene polymer (A) powder singly is also achieved by using a combination of ethylene polymer (A) powder and pellet.

The compounding amounts of the organic peroxide and ethylenically-unsaturated silane compound (B) per 100 weight parts of the total amount of ethylene polymer (A) powder and ethylene polymer (A) pellet in a melt extrusion modification process are respectively 0 to 1.0 weight part and 0.1 to 5 weight parts, preferably 0.01 to 0.5 weight parts and 0.1 to 4 weight parts. It should be noted that when producing an ethylene resin composition further containing a modified product of ethylene/α-olefin copolymer (C), the compound amount of ethylene polymer (A) is regarded as the total compounding amount of ethylene polymer (A) and ethylene/α-olefin copolymer (C).

The melt extrusion modification process in which ethylene polymer (A) and where necessary ethylene/α-olefin copolymer (C) are reacted with ethylenically-unsaturated silane compound (B) to produce a modified product is carried out using a known single-screw extruder or twin-screw extruder, for example. As to the extrusion conditions, extrusion is generally carried out at a temperature equal to or greater than the melting point of ethylene polymer (A). More specifically, when modifying ethylene polymer (A), extrusion is desirably carried out, for example, at 100° C. to 300° C., preferably 150° C. to 260° C., for 0.5 to 10 minutes.

In addition, when graft-modifying ethylene polymer (A) and where necessary ethylene/α-olefin copolymer (C) with radically-polymerizable ethylenically-unsaturated silane compound (B), a reducing substance may be added. The addition of a reducing substance can increase the graft amount of radically-polymerizable ethylenically-unsaturated silane compound (B).

UV Absorber (D), Light Stabilizer (E), Heat Resistance Stabilizer (F)

An ethylene resin composition of the present invention may contain at least one additive selected from the group consisting of ultraviolet absorber (D), light stabilizer (E), and heat resistance stabilizer (F). The compounding amount of the additive is preferably 0.005 to 5 weight parts per 100 weight parts of the total amount of ethylene polymer (A) and optional ethylene/α-olefin copolymer (C). It is preferable to add at least two types of the additives, most preferably all of the three types. When the compounding amount of the additive is within the above range, it is possible to fully ensure improvement in weather resistance and heat resistance stability, as well as to prevent reduction in the transparency of the resultant ethylene resin composition and its adhesion to glass.

Specific examples of UV absorber (D) include benzophenones such as 2-hydroxy-4-methoxybenzophenone, 2-2-dihydroxy-4-methoxybenzophenone, 2-hydroxy-4-methoxy-4-carboxybenzophenone, 2-hydroxy-4-N-octoxybenzophenone; benzotriazoles such as 2-(2-hydroxy-3,5-di-t-butylphenyl)benzotriazole, and 2-(2-hydroxy-5- methylphenyl)benzotriazole; and salicylates such as phenylsalicylate and p-octylphenylsalicylate.

Specific examples of light stabilizer (E) suitably used include hindered amines and hindered piperidines, such as bis(2,2,6,6-tetramethyl-4-piperidyl)sebacate, and poly[[6-(1,1,3,3-tetramethylbutyl)amino-1,3,5-triazine 2,4-diyl][(2,2,6,6-tetramethyl-4-piperidyl)imino]hexamethylene[(2,2,6,6-tetramethyl-4-piperidyl)imino]].

Specific examples of heat resistance stabilizer (F) include phosphite heat resistance stabilizers such as tris(2,4-di-tert-butylphenyl)phosphite, bis[2,4-bis(1,1-dimethylethyl)-6-methylphenyl]ethyl phosphite, tetrakis(2,4-di-tert-butylphenyl)[1,1-biphenyl]-4,4'-diylbisphosphonate, and bis(2,4-di-tert-butylphenyl)pentaerythritoldiphosphite; lactone heat resistance stabilizers such as a reaction product of 3-hydroxy-5,7-di-tert-butyl-furan-2-one and o-xylene; hindered phenol heat resistance stabilizers such as 3,3',3'',5,5',5''-hexa-tert-butyl-a,a',a''-(methylene-2,4,6-triyl)tri-p-cresol, 1,3,5-trimethyl-2,4,6-tris(3,5-di-tert-butyl-4-hydroxyphenyl)benzylbenzene, pentaerythritoltetrakis[3-(3,5-di-tert-butyl-4-hydroxyphenyl)propionate], octadecyl-3-(3,5-di-tert-butyl-4-hydroxyphenyl)propionate, and thiodiethylenebis[3-(3,5-di-tert-butyl-4-hydroxyphenyl)propionate]; sulfur heat resistance stabilizers; and amine heat resistance stabilizers. These heat resistance stabilizers can be used alone or in combination. Among them, phosphite heat resistance stabilizers and hindered phenone heat resistance stabilizers are preferable.

Additional Components/Additives

In addition to the above components, an ethylene resin composition of the present invention may contain other resin components and/or additives as needed.

Examples of such additional resin components include polyolefins other than ethylene polymer (A), for example, ethylene/α-olefin copolymers with a density of less than 900 kg/m$^3$, styrene- or ethylene-based block copolymers, and propylene-based polymers. These components are added in an amount of 0.0001 to 50 weight parts, preferably 0.0001 to 40 weight parts, per 100 weight parts of ethylene polymer (A) or per 100 weight parts of the total amount of ethylene polymer (A) and ethylene/α-olefin copolymer (C).

Examples of additives include, but not limited to, one or more additives selected from resins other than polyolefins, rubbers, plasticizers, fillers, pigments, dyes, antistatic agents, antimicrobial agents, antibacterial agents, flame retardants, crosslinking aids, and dispersants.

For the crosslinking aids, crosslinking aids known in the art for producing olefin resins can be used. Such crosslinking aids are a group of compounds having two or more double bonds in a molecule. Specific examples include monoacrylates such as t-butyl acrylate, laurylacrylate, cetyl acrylate, stearylacrylate, 2-methoxyethyl acrylate, ethylcarbitol acrylate, methoxytripropylene glycol acrylate; monomethacrylates such as t-butyl methacrylate, lauryl methacrylate, cetyl methacrylate, stearyl methacrylate, methoxyethylene glycol methacrylate, and methoxypolyethylene glycol methacrylate; diacrylates such as 1,4-butanediol diacrylate, 1,6-hexanediol diacrylate, 1,9-nonanediol diacrylate, neopentyl glycol diacrylate, diethylene glycol diacrylate, tetraethylene glycol diacrylate, polyethylene glycol diacrylate, tripropylene glycol diacrylate, and polypropylene glycol diacrylate; dimethacrylates such as 1,3-butanediol dimethacrylate, 1,6-hexanediol dimethacrylate, 1,9-nonanediol dimethacrylate, neopentyl glycol dimethacrylate, ethylene glycol dimethacrylate, diethylene glycol dimethacrylate, triethylene glycol dimethacrylate and polyethylene glycol dimethacrylate; triacrylates such as trimethylolpropane triacrylate, tetramethylolmethane triacrylate, pentaerythritol triacrylate; and trimethacrylates such as trimethylolpropane trimethacrylate and trimethylolethane trimethacrylate; tetraacrylates such as pentaerythritol tetraacrylate and tetramethylolmethane tetraacrylate; divinyl aromatic compounds such as divinylbenzene and di-i-propenylbenzene; cyanurates such as triallylcyanurate and triallylisocyanurate; diallyl compounds and triallyl compounds such as diallyl phthalate; oximes such as p-quinonedioxime and p-p'-dibenzoyl quinonedioxime; and maleimides such as phenylmaleimide. Among these crosslinking aids, diacrylates, dimethacrylates, and divinyl aromatic compounds are more preferable.

The compounding amount of the crosslinking aid is preferably 0 to 5 weight parts per 100 weight parts of ethylene polymer (A) or 100 weight parts of the total amount of ethylene polymer (A) and ethylene/α-olefin copolymer (C). When the compounding amount of the crosslinking aid is within the range, the resultant ethylene resin composition can have moderate crosslinked structure and thus have improved heat resistance, mechanical properties, and adhesion.

An ethylene resin composition of the present invention contains a modified product of ethylene polymer (A) modified with ethylenically-unsaturated silane compound (B) and where necessary a modified product of ethylene/α-olefin copolymer (C) modified with ethylenically-unsaturated silane compound (B). The total amount of grafted silane derived from ethylenically-unsaturated silane compound (B) in the ethylene resin composition is 50 to 8,000 ppm, preferably 100 to 7,000 ppm, more preferably 640 to 2960 ppm, further preferably 800 to 2960 ppm, most preferably 800 to 2800 ppm. When the grafted silane amount is less than 50 ppm, adhesion strength to glass, a backsheet and thin-film electrodes, particularly to glass, decreases. When the grafted silane amount is greater than 8,000 ppm, ethylenically-unsaturated silane compound (B) and organic peroxide, which have been abundantly used to increase the grafted silane amount, cause gels which reduce adhesion to the above-described adherends or degrades the resultant encapsulant sheet for solar cells.

The amount of silane grafted to molecular chains of ethylene polymer (A) and ethylene/α-olefin copolymer (C) can be measured through the following procedure:

(1) A sheet made of the ethylene resin composition is extracted by Soxhlet with acetone to prepare a sheet sample; and (2) The sheet sample is decomposed by wet process, diluted with pure water to a given final volume, and subjected to quantification of silicon (Si) with an ICP emission spectrometer (ICPS-8100, Shimadzu Corporation).

When an ethylene resin composition which contains ethylene polymer (A) and/or ethylene/α-olefin copolymer (C) graft-modified with ethylenically-unsaturated silane compound (B) is stored for a long term (about 6 months) before being used as encapsulant material for solar cells, there is a case that the encapsulant material has less adhesion to module components, particularly to a backsheet. A possible cause of this is that moisture seeps into the ethylene resin composition during the long-term storage to generate hydroxysilyl groups by hydrolysis of alkoxysilyl groups which are derived from ethylenically-unsaturated silane compound (B) grafted to molecular chains of, for example, ethylene polymer (A) in the ethylene resin composition, so that the hydroxylsilyl groups undergo condensation reactions with intermolecular or intramolecular hydroxysilyl groups or alkoxysilyl groups. In the case of a PET backsheet, for example, it is considered that there is a reduction in the concentration of alkoxysilyl groups of ethylenically-unsaturated silane compound (B) modifying ethylene polymer (A) and the like, the alkoxysilyl groups to be reacted with hydroxy groups present on the PET sheet surface, so that adhesion strength to the PET backsheet decreases. Even if the above condensation reactions do not take place during the long-term storage of the ethylene resin composition, upon pre-heating of a solar cell module during the lamination process, the hydroxysilyl groups generated by hydrolysis undergo condensation reactions with intermolecular or intramolecular hydroxysilyl groups or alkoxysilyl groups, the condensation reactions occurring before functional groups of adherends react with the alkoxysilyl groups derived from ethylenically-unsaturated silane compound (B) which have been grafted to molecular chains of ethylene polymer (A) and the like. Thus, in the case of a PET backsheet, there is a reduction in the concentration of alkoxysilyl groups which should react with hydroxy groups of PET, thus reducing adhesion strength to the PET backsheet.

The amount of free silane derived from ethylenically-unsaturated silane compound (B) remaining in an ethylene resin composition of the present invention is preferably 5 to 40 wt %, more preferably 5 to 35 wt %, further preferably 5 to 30 wt %, based on the total amount of silane in the ethylene resin composition. When the free silane content is less than 5 wt %, it results in reduced adhesion to module components, particularly to a backsheet, when the ethylene resin composition is stored for a long term (about 6 months) before used as encapsulant material for solar cells. This is considered to be due to the that moisture seeps into the ethylene resin composition during the long-term storage to generate hydroxysilyl groups by hydrolysis of alkoxysilyl groups which are derived from ethylenically-unsaturated silane compound (B) grafted to molecular chains of ethylene polymer (A) and/or ethylene/α-olefin copolymer (C), so that the hydroxylsilyl groups undergo condensation reactions with intermolecular or intramolecular hydroxysilyl groups or alkoxysilyl groups. On the other hand, when the ethylene resin composition contains a small amount of free ethylenically-unsaturated silane compound (B), which is not participating in the graft modification, moisture seeping into the ethylene resin composition hydrolyzes alkoxysilyl groups of the free ethylenically-unsaturated silane compound (B). This prevents the seeping moisture from hydrolyzing alkoxysilyl groups derived from ethylenically-unsaturated silane compound (B), the alkoxysilyl groups being grafted to molecular chains of ethylene polymer (A) and/or ethylene/α-olefin copolymer (C). Thus, in the case of a PET backsheet, it is considered that there is no reduction in the concentration of alkoxysilyl groups in the ethylene resin composition which are to be reacted with hydroxy groups of PET, thus providing adhesion strength to the PET backsheet.

On the other hand, when the free silane content is greater than 40 wt %, adhesion to the adherends decreases. That is, monomeric ethylenically-unsaturated silane compound (B) remaining in the ethylene resin composition has a higher diffusion rate than ethylenically-unsaturated silane compound (B) that is graft-modifying ethylene polymer (A) and the like. For this reason, during the lamination process, molecules of free ethylenically-unsaturated silane compound (B) diffuse faster than molecules of ethylenically-unsaturated silane compound (B) participating in the graft modification, thus migrating through the interface between the adherends and becoming more likely to react with polar groups at the interface. Moreover, molecules of free ethylenically-unsaturated silane compound (B) undergo condensation reactions. This hinders reactions between ethylenically-unsaturated silane compound (B) participating in the graft modification of ethylene polymer (A) and polar groups of the adherends, thus reducing adhesion strength to the adherends.

The amount of free silica remaining in the ethylene resin composition (which is not participating in the graft modification of ethylene polymer (A) and the like), and free silica content can be measured through the following procedure:

1) A sheet sample made of the ethylene resin composition of the present invention is prepared;
2) The sheet sample is decomposed by wet process, diluted with pure water to a given final volume, and subjected to quantification of total silicon (Si) amount with an ICP emission spectrometer (ICPS-8100, Shimadzu Corporation).
3) The grafted amount of silica is subtracted from the total silica amount to find "free silica amount"; and
4) The percentage ratio of free silica amount to total silica amount is calculated to find "free silica content."

In an ethylene resin composition of the present invention, the gel fraction of ethylene polymer (A) modified with ethylenically-unsaturated silane compound (B) and optional ethylene/α-olefin copolymer (C) modified with ethylenically-unsaturated silane compound (B) is 30% or less. When the gel fraction is greater than 30%, it results in poor adhesion to adherends or poor appearance of an encapsulant sheet for solar cells, as described above.

2. Encapsulant Material for Solar Cells

An ethylene resin composition of the present invention has good adhesion to glass and a back protective member, as well as good weather resistance, heat resistance, volume resistivity, electrical insulation, moisture permeability, electrode corrosion resistance, moldability, and process stability. The ethylene resin composition is suitably used as encapsulant material for solar cells in cell module known in the art. In particular, an ethylene resin composition which contains a modified product of ethylene polymer (A) with a density of 900 to 920 kg/m$^3$ and where necessary a modified product of ethylene/α-olefin copolymer (C) has good transparency and flexibility, as well as can be suitably used for crystalline solar cell modules.

A typical process can be used for producing encapsulant material for solar cells of the present invention; the above-described components are preferably melt-blended with a kneader, a roll, a banbury mixer, an extruder, and the like.

Encapsulant Sheet for Solar Cells

According to a preferred embodiment of the present invention, there is provided encapsulant material (or sheet) for solar cells which contains a sheet (or layer) made of the ethylene resin composition of the present invention. The encapsulant sheet for solar cells may constitute a multilayer structure together with other layers as long as it includes at least one sheet (or layer) made of the ethylene resin composition of the present invention.

The sheet (layer) made of the ethylene resin composition of the present invention has a thickness of 0.01 to 2 mm, preferably 0.05 to 1 mm, more preferably 0.1 to 1 mm, still more preferably 0.15 to 1 mm, yet more preferably 0.2 to 1 mm, still yet more preferably 0.2 to 0.9 mm, yet still more preferably 0.3 to 0.9 mm, most preferably 0.3 to 0.8 mm. When the thickness of the sheet (layer) made of the ethylene resin composition of the present invention is within the range, possible breakage of glass, solar cells, thin-film electrodes, etc., during the lamination process can be avoided. Moreover, lamination of a solar cell module can be effected at low temperatures. Further, since the sheet (layer) made of the ethylene resin composition of the present invention has sufficient light transmittance, it is possible to manufacture a solar cell module with high photovoltaic power generation.

There are no particular limitations on the method of forming a sheet (layer) made of the ethylene resin composition of the present invention; any molding method known in the art (e.g., cast molding, extrusion sheet molding, inflation molding, injection molding, compression molding or calendar molding) can be employed. For example, extrusion sheet molding is carried out in an extruder in which ethylene polymer (A), where necessary ethylene/α-olefin copolymer (C), ethylenically-unsaturated silane compound (B), UV absorber (D), light stabilizer (E), heat resistance stabilizer (F) and other optional additives are melt-kneaded while modifying ethylene polymer (A) and ethylene/α-olefin copolymer (C) with ethylenically-unsaturated silane compound (B). In this way an encapsulant material for solar cells which contains a sheet made of the ethylene resin composition of the present invention can be produced.

In the case where two different types of ethylene polymer (A), i.e., ethylene polymers (A-1) and (A-2), are to be used, any of the following melt-kneaded products may be extruded into sheet to produce encapsulant material for solar cells which contains a sheet (or layer) made of the ethylene resin composition of the present invention:

(1) A product obtained by melt-kneading the following components (i) to (iii): (i) ethylene polymer (A-1) which has been modified with ethylenically-unsaturated silane compound (B) through a melt extrusion modification process; (ii) ethylene Polymer (A-2); and (iii) additives ((D), (E), (F) and optional additives);

(2) A product obtained by melt-kneading the following components (i) and (ii): (i) a melt-kneaded product of additives ((D), (E), (F) and optional additives) and ethylene polymer (A-2); and (ii) a modified product of ethylene polymer (A-1) modified with ethylenically-unsaturated silane compound (B) through a melt extrusion modification process;

(3) A product obtained by melt-kneading the following components (i) to (iii): (i) a modified product of ethylene polymer (A-1) modified with ethylenically-unsaturated silane compound (B) through a melt extrusion modification process; (ii) a melt-kneaded product of additives ((D), (E), (F) and optional additives); and (iii) ethylene polymer (A-2); and (4) A product obtained by melt-kneading the following components (i) and (ii): (i) a melt-kneaded product of additives ((D), (E), (F) and optional additives), ethylene polymer (A-1) and ethylenically-unsaturated silane compound (B); and (ii) ethylene polymer (A-2).

Two different ethylene polymers (A-1) and (A-2) may be identical or different as long as they satisfies the requirements a) to e) for ethylene polymer (A) according to the present invention.

A sheet (or layer) made of the ethylene resin composition may be embossed on its surface. By embossing the surface of encapsulant sheets for solar cells, possible blocking between the encapsulant sheets or between the encapsulant sheet and other sheet can be avoided. Moreover, since embossed features reduce the storage modulus of encapsulant material (sheet) for solar cells, they act as a cushion for solar cells and other module components during the lamination process and thus can avoid breakage of the cells.

Porosity (P) of encapsulant material (sheet) for solar cells is preferably 10% to 50%, more preferably 10% to 40%, further preferably 15% to 40%, the porosity (P) being defined as the percentage ratio of the total volume ($V_H$) of concaved portions per unit area of the encapsulant material (sheet) to its apparent volume ($V_A$), ($V_H/V_A \times 100$). The apparent volume ($V_A$) of the encapsulant material (sheet) for solar cells is found by multiplying unit area by maximum thickness of the encapsulant sheet.

When the porosity (P) is less than 10%, it results in failure to sufficiently reduce the elasticity of the encapsulant material for solar cells and to provide sufficient cushion. Thus, when module layers are laminated together in the second stage (pressing step) during the manufacture of a solar cell module, breakage of silicon cells or solder that fixes the silicon cell to the electrode occurs in the case of crystalline solar cells, or breakage of the silver electrode occurs in the case of thin-film solar cells. Specifically, in the case where porosity (P) of encapsulant material for solar cells which contains a sheet made of the ethylene resin composition is less than 10%, when the encapsulating material is locally loaded with pressure, convex parts of the encapsulant material is hard to deform. This causes breakage of, for example, silicon cells during the lamination process as a result of local application of large pressure on the silicon cells. Moreover, when porosity P is less than 10%, there is less space for air to travel through, resulting in failure to pump out the air during the lamination process. The air trapped in the solar cell module layers may deteriorate the appearance of the module, or the moisture in the air may corrode electrodes and other components during long-term usage. Moreover, during the lamination process the melted ethylene resin composition fails to fill the space, and therefore the excessive ethylene resin composition may squeeze out of the solar cell module layers to contaminate the laminator.

On the other hand, when porosity P is greater than 80%, it becomes likely that air cannot be completely removed during the pressing step of the lamination process, so that the air remains trapped in the solar cell module layers. The air trapped in the solar cell module layers may deteriorate the appearance of the solar cell module, or the moisture in the air may corrode electrodes and other components during long-term usage. Failure to completely remove air during the pressing step of the lamination process also reduces the contact area between the encapsulant material for solar cells and adherends, leading to poor adhesion.

Porosity (P) can be found through the following calculation. The apparent volume $V_A$ (mm$^3$) of embossed encapsulant material for solar cells is found by multiplying maximum thickness $t_{max}$ (mm) of the encapsulant material by unit area (e.g., 1 mm$^2$=1,000×1,000=10$^6$ mm$^2$) as follows:

$$V_A(\text{mm}^3) = t_{max}(\text{mm}) \times 10^6 (\text{mm}^2) \qquad (1)$$

On the other hand, the actual volume $V_0$ (mm$^3$) of the encapsulant material for the unit area is calculated by substituting ρ (specific gravity (g/mm$^3$) of resin constituting the encapsulant material) and W (actual weight (g) of the encapsulant material per unit area (1 m$^2$) into the following equation (2):

$$V_0(\text{mm}^3) = W/\rho \qquad (2)$$

The total volume $V_H$ (mm$^3$) of concaved portions per unit area of the encapsulant material is found by subtracting "actual volume ($V_0$)" from "apparent volume ($V_A$)" as shown in the following equation (3):

$$V_H(\text{mm}^3) = V_A - V_0 = V_A - (W/\rho) \qquad (3)$$

Porosity (%) can thus be found using the following equation:

$$\text{Porosity}(\%) = V_H/V_A \times 100 = (V_A - (W/\rho))/V_A \times 100 = 1 - W/(\rho \cdot V_A) \times 100 = 1 - W/(\rho \cdot t_{max} \times 10^6) \times 100$$

Alternatively, porosity P can be measured by microscopic observation, image processing, etc., of an actual cross section or embossed surface of encapsulant material for solar cells.

The depth of a concave pattern formed by embossing is preferably 20% to 95% of the maximum thickness of encapsulating material for solar cells, more preferably 50% to 95%, further preferably 65% to 95%. The percentage ratio of the depth of the concave pattern to the maximum sheet thickness $t_{max}$ may be referred to as the "depth ratio" of the concave pattern.

The depth of a concave refers to the vertical interval D between the top of the convex pattern and the bottom of the concave pattern on the embossed surface of the encapsulant material for solar cells. Maximum thickness $t_{max}$ of encapsulant material for solar cells refers to: the distance from the top of the convex pattern on the embossed surface to the other side surface where the encapsulant material is embossed on one side; the distance from the top of the convex pattern on one side surface to the top of the convex pattern on the other side surface where the encapsulant material is embossed on both sides.

Embossing may be performed on one or both sides surface of the encapsulant material for solar cells. When deepening the concave pattern, embossing is preferably performed on one side surface of the encapsulant material for solar cells. When the encapsulant material is embossed only on one side surface, $t_{max}$ is 0.01 to 2 mm, preferably 0.05 to 1 mm, more preferably 0.1 to 1 mm, still more preferably 0.15 to 1 mm, yet more preferably 0.2 to 1 mm, still yet more preferably 0.2 to 0.9 mm, yet still more preferably 0.3 to 0.9 mm, most preferably 0.3 to 0.8 mm. When $t_{max}$ is within the ranges, not only possible breakage of module components such as glass, solar cells, and thin-film electrodes can be avoided, but the lamination of the solar cell module is made possible at relatively low temperatures. Moreover, the encapsulant material for solar cells can have sufficient light transmittance, and a solar cell module in which it is used generates high photovoltaic power.

Encapsulant material for solar cells according to the present invention, which has been embossed at least on one side surface, preferably has a storage modulus (E') of $2.5 \times 10^5$ to $1.5 \times 10^8$ Pa as measured at 80° C. by a rheometrics solids analyzer. The reason that storage modulus (E') at 80° C. is specified in the present invention will be described below.

When a solar cell module is laminated in a laminator at 150° C. during the manufacturing process, the vacuum chamber is first vacuumed in the first stage for about 2 to 4 minutes for de-airing along with heating, and then in the second stage the module is pressed for the adhesion of the encapsulant material to module components. During vacuuming in the first stage, the temperature of the encapsulant material in the laminator rises from room temperature to about 80° C. Thus, storage modulus (E') at 80° C. measured by a rheometrics solids analyzer is a critical factor for the pressing step in the second stage.

When storage modulus (E') at 80° C. of the encapsulant material is less than $2.5 \times 10^5$ Pa, there is tendency that the encapsulant material squeezes out of the module layers when pressed during the lamination process to contaminate the laminator to reduce the productivity of solar cell modules. The adhesion strength of the encapsulant material to module components tends to decrease. Moreover, when the pressure is released after the lamination process in a case where a glass substrate as an adherend is placed at the laminator top side, the glass substrate jumps due to pressure release (a phenomenon called "spring back"). At this time, the encapsulant material cannot follow the deformation of the glass substrate, which may cause voids at the interface between the encapsulant material and the glass substrate.

When storage modulus (E') at 80° C. is greater than $1.5 \times 10^8$ Pa, the encapsulant material has a high elasticity and thus becomes hard at the pressing step in the second stage. Thus, in the case of a crystalline solar cell, silicon cell or solder that fixes the silicon cell to the electrode breaks. And in the case of a thin-film solar cell, the silver electrode, for example, breaks. Moreover, since the module cannot be fully pressed during the second stage, the air present in the embossed pattern cannot be completely pumped out and may remain trapped in the solar cell module.

Storage modulus (E') at 80° C. can be adjusted by changing porosity (P) of the encapsulant material. For example, by increasing porosity (P) by embossing, storage modulus (E') at 80° C. can be lowered. Storage modulus (E') at 80° C. can also be lowered by increasing the ratio of ethylene/α-olefin copolymer (C) with respect to ethylene polymer (A). Storage modulus (E') at 80° C. can also be lowered by reducing the density of the ethylene resin composition.

Measurement of storage modulus (E') at 80° C. by a rheometrics solids analyzer can be made as follows, for example:

A strip of sample (3 mm width×30 mm length) is cut out from a sheet of 1 mm thickness, and heated from −70° C. to a measurable temperature range with RSA-II (TA Instruments, Inc.) at the frequency of 1 Hz and the heating rate of 3° C./min under a nitrogen atmosphere, to find storage modulus (E') at 80° C.

As described above, an encapsulating material for solar cells that has specific ranges of storage modulus and porosity has the advantage of capable of avoiding breakage of solar cells and air entrapment during the lamination process for a solar cell module.

A sheet (or layer) made of the ethylene resin composition of the present invention may come in sheet form in size to fit the solar cell module or in roll form ready for cutting into a sheet of size to fit the solar cell module.

Desirably, a sheet (or layer) made of the ethylene resin composition of the present invention, when prepared as 0.5 mm-thick sample, has an internal haze of 1% to 60%, preferably 1% to 40%.

The encapsulant sheet for solar cells is only required to include at least one sheet (or layer) made of the ethylene resin composition of the present invention. Thus, the encapsulant sheet may include either one or more layers made of the ethylene resin composition of the present invention. However, it is preferable to provide only one such a layer in view of simplifying the structure for lower production costs and reducing the reflection of light at the layer-to-layer interface for efficient utilization of light.

An encapsulant sheet for solar cells according to a preferred embodiment of the present invention may consist of one or more sheets (or layers) made of the ethylene resin composition of the present invention or may additionally include one or more layers other than the sheets (or layers) made of the ethylene resin composition of the present invention (hereinafter also referred to as "additional layer").

Examples of additional layers include, when classified according to the intended purpose, hardcoat layers for protecting front or back side, adhesion layers, antireflection layers, gas barrier layers, antifouling layers, backsheets, and back protective layers for solar cell modules. Examples of additional layers include, when classified according to the material, layers made of UV curable resins, layers made of thermosetting resins, layers made of polyolefin resins, layers made of carboxylic acid-modified polyolefin resins, layers made of fluorine resins, layers made of cyclic olefin polymers (copolymers), layers made of polyesters, glass, and layers made of inorganic compounds. Preferred examples are layers made of polyolefin resins, layers made of carboxylic acid-modified polyolefin resins, layers made of fluorine resins, layers made of cyclic olefin polymers (copolymers), layers made of polyester resins, and glass.

There are no particular limitations on the positional relationship between the sheet (or layer) made of the ethylene resin composition of the present invention and the additional layer(s). That is, the additional layer(s) may be provided between two or more layers made of the ethylene resin composition of the present invention, may be located as the outermost layer of the encapsulant sheet for solar cells, or may be provided at other positions. The additional layer(s) may be provided on either one side or both sides of the sheet (or layer) made of the ethylene resin composition of the present invention. There are no particular limitations on the number of the additional layers to be provided; it is possible to provide either none or any number of the additional layers.

There are no particular limitations on the lamination method in which to laminate the sheet (or layer) made of the ethylene resin composition of the present invention and the additional layer(s). It is preferable to employ a method in which a laminate is obtained by co-extrusion using a known melt extruder such as a cast molding machine, an extrusion sheet molding machine, an inflation molding, an injection molding machine or the like, or a method in which one film formed previously is laminated to the other film by melting or heating so as to obtain a laminated film.

The lamination may be effected through a dry lamination process or a heat lamination process in which a suitable adhesive (e.g., maleic anhydride-modified polyolefin resin such as "ADMER" (Mitsui Chemicals, Inc.) and "MODIC" (Mitsubishi Chemicals, Inc.); low (non) crystalline elastic polymers such as unsaturated polyolefins; acrylic adhesives represented by a terpolymer of ethylene, acrylate, and maleic anhydride (e.g., "BONDINE" (Sumica CDF)); ethylene/vinyl acetate copolymers; or adhesive resin compositions containing the foregoing) is used. Adhesives with heat resistance of about 120° C. to about 150° C. are suitably used; preferable examples thereof include polyester- or polyurethane-based adhesives. In order to improve adhesion between the two layers, they may be subjected to silane coupling treatment, titanium coupling treatment, corona treatment, and/or plasma treatment, for example.

Desirably, an encapsulant sheet for solar cells of the present invention, when prepared as 0.5 mm-thick sample, has an internal haze of 1% to 60%, preferably 5% to 50%.

Solar Cell Module

An encapsulant material for solar cells of the present invention, and an encapsulant sheet for solar cells, which is a preferred embodiment of the encapsulant material, both have excellent properties as described above. Thus, a solar cell module manufactured using the encapsulant material and/or encapsulant sheet has the effects according to the present invention.

Examples of solar cell modules include crystalline solar cell modules in which solar cells made of crystalline silicon or the like are sandwiched between encapsulant sheets for solar cells and the module is covered with protective sheets on either side. That is, a typical solar cell module consists of, in order from top, a protective sheet for solar cell module (front protective member), an encapsulant sheet for solar cells, solar cells, an encapsulant sheet for solar cells, and a protective sheet for solar cell modules (back protective member). The structure of the solar cell module, which is a preferred embodiment of the present invention, is not limited to the above structure. Some of the above module components may be disposed of or one or more additional layers may be provided as needed as long as the object of the present invention is not adversely affected. Examples of the additional layers include, but not limited to, adhesion layers, shock absorbing layers, coating layers, antireflection layers, back re-reflection layers, and light diffusion layers. These layers can be provided in place in any desired location according to the intended purpose and their characteristics.

(1) Crystalline Silicon Solar Cell Module

FIG. 1 is a cross-sectional view illustrating an example of a configuration of crystalline solar cell module 20. As illustrated in FIG. 1, solar cell module 20 includes a plurality of crystalline silicon solar cells 22 electrically interconnected via interconnectors 29, a pair of front protective member 24 and back protective member 26 which sandwiches solar cells 22, and encapsulant layer 28 which encapsulates solar cells 22. And encapsulant layer 28 is sandwiched by the protective members. Encapsulant layer 28 is produced by bonding together encapsulant sheets for solar cells of the present invention and pressing the bonded sheets under heating. Encapsulant layer 28 contacts electrodes respectively formed on the light-incident surface and back surface of each solar cell 22. These electrodes are current collectors respectively formed on the light-incident surface and back surface of each solar cell 22, and each includes collector lines, tab-type busbars, back electrode layer, etc.

Figure 2:
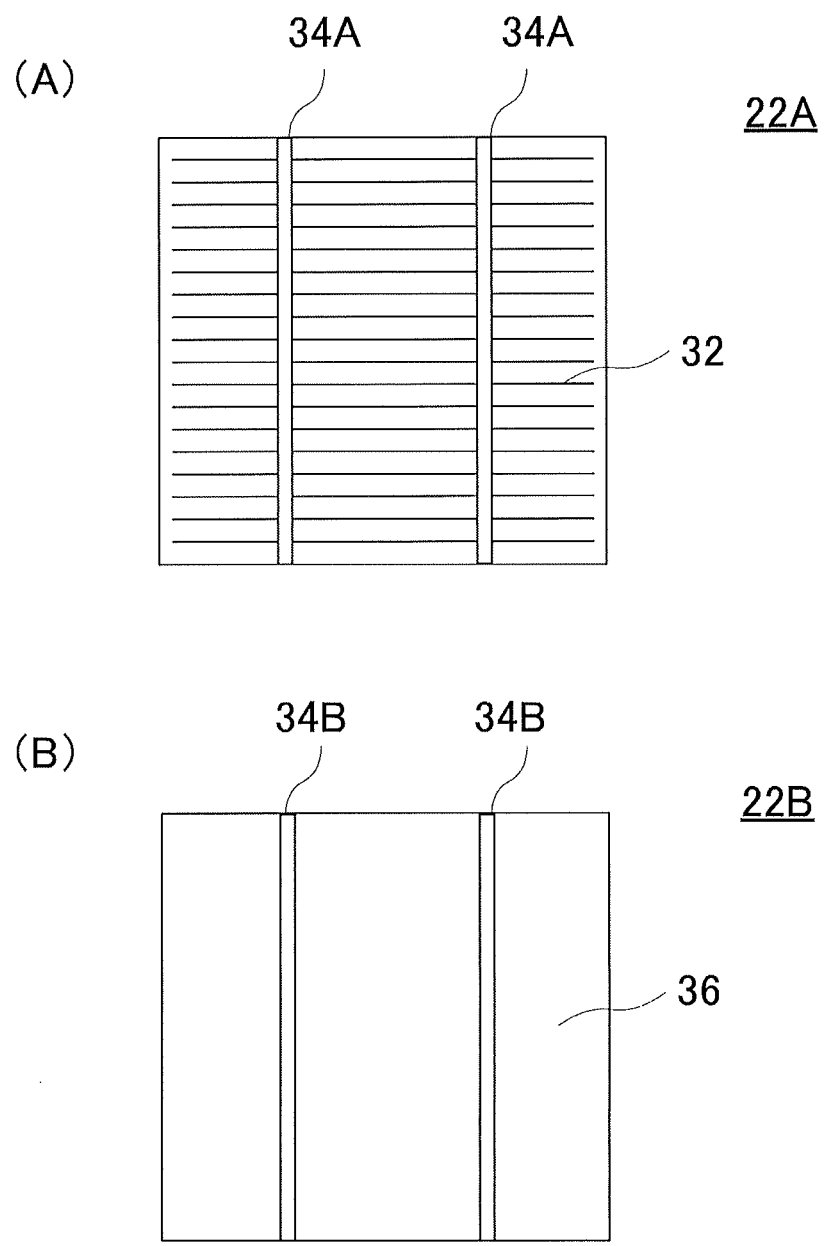
FIG. 2A is a plan view illustrating an example of a configuration of a light-incident surface of a solar cell.
FIG. 2B is a plan view illustrating an example of a configuration of a back surface of a solar cell.

FIG. 2 is a plan view illustrating an example of a configuration of light-incident surface 22A or back surface 22B of solar cell 22. As illustrated in FIG. 2A, solar cell 22 includes on light-incident surface 22A multiple collector lines 32 and tab-type busbars 34A that are connected to interconnectors 29 and collect electrical charges from collector lines 32.

As illustrated in FIG. 2B, solar cell 22 includes conductive layer (back electrode) 36 formed on the entire surface of back surface 22B, and tab-type busbars 34B are formed thereon that are connected to interconnectors 29 and collect electrical charges from conductive layer 36.

The line width of collector lines 32 is, for example, about 0.1 mm, the line width of tab-type busbars 34A is, for example, about 2 mm to about 3 mm, and the line width of tab-type busbars 34B is, for example, about 5 mm to about 7 mm. The thickness of collector lines 32, tab-type busbars 34A and tab-type busbars 34B is, for example, about 20 μm to about 50 μm.

Collector lines 32, tab-type busbars 34A and tab-type busbars 34B preferably contain a metal with high conductivity. Examples of metals with high conductivity include gold, silver and copper, with silver, silver compounds and silver-containing alloys being preferable for their high conductivity and high corrosion resistance.

Conductive layer 36 preferably contains not only a metal with high conductivity, but also a component with high light reflectivity, such as aluminum, for reflecting light incident on the light-incident surface to enhance the opto-electronic conversion efficiency.

Collector lines 32, tab-type busbars 34A, tab-type busbars 34B and conductive layer 36 are formed by applying a conductive material solution containing the conductive metal onto either light-incident surface 22A or back surface 22B of solar cell 22 by, for example, screen printing to a thickness of 50 μm, drying the applied material and, where necessary, baking the applied material at 600° C. to 700° C.

Front protective member 24 needs to be transparent as it is placed on the light-incident surface side. Examples of front protective member 24 include transparent glass plates and transparent resin films. Back protective member 26, on the other hand, needs not to be transparent; therefore, the material thereof is not particularly limited. Examples of back protective member 26 include glass substrates and plastic films, with glass substrates being suitable for high resistance and transparency.

Solar cell module 20 can be obtained by any manufacturing process. Solar cell module 20 can be obtained by, for example, a manufacturing process including the steps of: obtaining a stack in which module components are stacked in the order of back protective member 26, encapsulant sheet for solar cells, solar cells 22, encapsulant sheet for solar cells, and front protective member 24; pressing the stack with a laminator or the like; and optionally heating the stack to cure the encapsulant.

Another form of solar cell module is a thin-film (amorphous) solar cell module in which module components are stacked in the order of solar cells; encapsulant sheet for solar cells, and protective sheet for solar cell modules (back protective member). Each of the solar cells is manufactured by forming a film of amorphous silicon of several micrometers thickness onto a glass or film substrate by chemical vapor deposition (CVD) using silane gas, and further depositing thereon an electrode (e.g., silver electrode) by sputtering as needed.

(2) Thin-Film Silicon (Amorphous Silicon) Solar Cell Module

A thin-film silicon solar cell module may be configured as (1) a stack in which module components are stacked in the order of transparent front protective member (glass substrate), thin-film solar cells, encapsulant layer, and back protective member; (2) a stack in which module components are stacked in the order of transparent front protective layer, encapsulant layer, thin-film solar cells, encapsulant layer, and back protective layer; or the like. The transparent front protective member, back protective member and encapsulant layer are identical to those for the crystalline silicon solar cell module described above.

A thin-film silicon solar cell of a thin-film silicon solar cell module with configuration (1) includes, in order, a transparent electrode layer, a silicon p-i-n layer, and a back electrode layer, for example. Examples of materials of the transparent electrode layer include semiconductor oxides such as $In_2O_3$, $SnO_2$, $ZnO$, $Cd_2SnO_4$, and ITO ($In_2O_3$ doped with Sn). The back electrode layer includes a silver thin film layer, for example. Each layer is formed by plasma chemical vapor deposition (CVD) or sputtering.

The encapsulant layer is placed so as to contact the back electrode layer (e.g., silver thin film layer). Since the transparent electrode layer is formed on the transparent front protective member, it is often the case that the encapsulant layer is not provided between the front protective layer and transparent electrode layer.

A thin-film silicon solar cell of a thin-film solar cell module with configuration (2) includes, in order, a transparent electrode layer, a silicon p-i-n layer, and a metal foil or thin metal layer (e.g., silver thin film layer) formed on a heat-resistant polymer film, for example. Examples of the metal foil include stainless steel foil. Examples of the heat-resistant polymer film include polyimide films.

The transparent electrode layer and silicon p-i-n layers are formed by CVD or sputtering as with those described above. That is, the silicon p-i-n layer is formed on the metal foil or the thin metal layer formed on the heat-resistant polymer film, and the transparent electrode layer is formed on the silicon p-i-n layer. The thin metal layer on the heat-resistant polymer film may also be formed by CVD or sputtering.

In this case, the encapsulant layer is provided between the transparent electrode layer and the front protective member, and between the metal foil or heat-resistant polymer film and the back protective member. In this way the encapsulant layer made of an encapsulant sheet for solar cells contacts the electrodes of solar cells, such as collector lines, tab-type busbars, and conductive layer.

Thin-film silicon solar cells of a crystalline silicon solar cell module with configuration (1) have silicon layers that are thinner than those for crystalline silicon solar cell modules and thus are less prone to breakage by the pressure applied during the manufacture of the solar cell module or by external impact during operation. For this reason, encapsulant sheets for thin-film solar cell modules may be less flexible than those for crystalline silicon solar cell modules. On the other hand, since the electrodes of thin-film solar cells are formed of metal thin film layers, there is fear that power generation efficiency significantly decreases when they are degraded by corrosion. Accordingly, an encapsulant sheet for solar cells which contains a sheet made of the ethylene resin composition of the present invention, which is less flexible than an ethylene/vinyl acetate (EVA)-based encapsulant sheet but does not necessarily require a crosslinking agent which causes cracked gas, is suitably used as an encapsulant sheet for thin-film solar cell modules with configuration (2).

Solar cell module can include silicon solar cells. Examples of solar cell modules including the silicon solar cell include a hybrid-type (HIT) solar cell module in which crystalline silicon and amorphous silicon are stacked; a multi-junction (tandem) solar cell module in which silicon layers with different absorption wavelength ranges are stacked; and a spherical silicon solar cell module in which a large number of spherical silicon particles (about 1 mm in diameter) and a concave mirror (also serves as an electrode) of 2 to 3 mm diameter are combined. Other examples thereof include a field-effect solar cell module in which the role of the conventional amorphous silicon p-type window layer with p-i-n junction is changed from "insulated transparent electrode" to "inversion layer induced by electric field effect." Still other forms of solar cell module include a GaAs solar cell module in which monocrystalline GaAs is used in solar cells; a CIS or CIGS (chalcopyrite) solar cell module in which I-III-VI compounds called chalcopyrite compounds formed of Cu, In, Ga, Al, Se, S and the like are used instead of silicon in solar cells; a CdTe—CdS solar cell module in which thin films of Cd compound are used in solar cells; and a $Cu_2ZnSnS_4$ (CZTS) solar cell module. The encapsulant material for solar cells of the present invention can be used for all types of the above solar cell modules.

An encapsulant layer disposed under a photovoltaic device as a solar cell module component needs to have adhesion to an electrode or a back protective layer which are disposed over the photovoltaic device. The encapsulant layer disposed under a photovoltaic device also needs to have thermal plasticity to keep smooth the back surface of the solar cell device as a photovoltaic device. Further, the encapsulant layer disposed under a photovoltaic device needs to have excellent scratch resistance and shock absorbance in order to protect the solar cell device as a photovoltaic device.

The above encapsulant layer preferably has heat resistance. In particular, it is preferable that the ethylene resin composition constituting the encapsulant layer does not undergo degeneration, degradation or decomposition due to heat during the vacuum lamination process for the manufacture of a solar cell module or due to thermal action by sunlight during the long-term operation. If the additives ooze from the ethylene resin composition or any decomposed product yields, they act on the photovoltaic surface (device surface) of the solar cells to deteriorate their function and performance. Thus, heat resistance is an indispensable property for the encapsulant layer for solar cell modules.

The above encapsulant layer preferably has excellent moisture absorbency. Excellent moisture absorbency prevents moisture permeation from the back surface of the solar cell module, thus avoiding possible corrosion and degradation of the photovoltaic devices of the solar cell module.

The above encapsulant layer is different from the one disposed over the photovoltaic device, and needs not necessarily to be transparent.

The encapsulant material of the present invention has characteristics described above. Thus, the encapsulant material of the present invention can be suitably used as an encapsulant material for solar cells for the back surface of crystalline solar cell modules and for thin-film solar cell modules which are susceptible to moisture permeation.

Front Protective Member for Solar Cell Module

There are no particular limitations on the front protective member used in a solar cell module. However, since the member is located as the outermost layer of a solar cell module, it preferably has such properties that allow for long-term outdoor exposure, including weather resistance, water repellency, contamination resistance, and mechanical strength. The front protective member is preferably a sheet with less optical loss and high transparency for efficient utilization of sunlight.

Examples of front protective members suitably used for the solar cell module include resin films made of polyester, fluorine resin, acrylic resin, cyclic olefin (co)polymer, ethylene/vinyl acetate copolymer or the like, and glass substrates.

Preferable resin films include films made of polyester resins, which are excellent in transparency, strength, costs, etc., particularly films made of polyethylene terephthalate resins and films made of fluorine resin which have good weather resistance.

Examples of fluorine resins include a tetrafluoroethylene ethylenic copolymers (ETFE), polyvinyl fluoride resins (PVF), polyvinylidene fluoride resins (PVDF), polytetrafluoroethylene resins (TFE), tetrafluoroethylene/hexafluoride propylene copolymers (FEP), and polyethylene chloride trifluoride resins (CTFE). Polyvinylidene fluoride resins are superior in terms of weather resistance, but tetrafluoroethylene/hexafluoride propylene copolymers are more superior in terms of achieving both weather resistance and mechanical strength. In order to improve adhesion to other layers such as the encapsulant layer, the front protective layer is preferably subjected to corona treatment and/or plasma treatment, for example. Moreover, in order to improve mechanical strength, it is possible to employ a sheet subjected to stretch treatment, such as a biaxially stretched polypropylene sheet.

When a glass substrate is employed as the front protective member for solar cell modules, the glass substrate preferably has total light transmittance of 80% or more, more preferably 90% or more, in the wavelength range of 350 nm to 1,400 nm. For the glass substrate, clear glass, which has less absorption in the infrared region, is generally used; however, soda lime glass has less effect on the output characteristics of the solar cell module as long as the glass substrate is 3 mm or less in thickness. Moreover, although reinforced glass can be obtained by thermal treatment to improve the mechanical strength of the glass substrate, a float glass substrate not subjected to thermal treatment may be employed. In order to suppress light reflection, the glass substrate may also be provided with antireflective coating on the light-incident surface.

Back Protective Member for Solar Cell Module

There are no particular limitations on the back protective member used in a solar cell module. However, since the member is located as the outermost layer of a solar cell module, weather resistance, mechanical strength and other properties are required as with the front protective member described above. Thus, the back protective member may be formed of the same material as the front protective member. Namely, the above materials usable for the front protective member can be used for the back protective member. In particular, polyester resins and glass can be used suitably.

Since sunlight is not incident on the back protective member, transparency, which is required for the front protective member, is not necessarily required. Thus, in order to increases the mechanical strength or to prevent deformation or warpage of the solar cell module, a reinforcement plate may be attached. For the reinforcement plate, for example, a steel plate, a plastic plate, a glass fiber reinforced plastic (FRP) plate or the like can be used suitably.

The encapsulant material for solar cells of the present invention may be integrated with the back protective member for solar cell modules. By integrating the encapsulant material with the back protective member, it is possible to dispose of the step of cutting both the encapsulant material and back protective member into the size of a solar cell module upon assembling. Moreover, it is possible to shorten the lay-up process by stacking a sheet of the encapsulant material integrated with the back protective member, rather than individually stacking the encapsulant material and back protective member.

In a case where the encapsulant material of the present invention is to be integrated with the back protective member, there are no particular limitations on the lamination method in which to laminate the encapsulate material to the back protective member. It is preferable to employ a method in which a laminate sheet is obtained by co-extrusion using a known melt extruder such as a cast molding machine, an extrusion sheet molding machine, an inflation molding, an injection molding machine or the like, or a method in which one of the two layers previously formed is laminated to the other one by melting or heating.

The lamination may be effected through a dry lamination process or a heat lamination process in which a suitable adhesive is used. Example of the adhesive includes maleic anhydride-modified polyolefin resin such as "ADMER" (Mitsui Chemicals, Inc.) and "MODIC" (Mitsubishi Chemicals, Inc.); low (non) crystalline elastic polymers such as unsaturated polyolefins; acrylic adhesives represented by a terpolymer of ethylene, acrylate, and maleic anhydride (e.g., "BONDINE" (Sumica CDF)); ethylene/vinyl acetate copolymers; or adhesive resin compositions containing the foregoing).

Adhesives with heat resistance of about 120° C. to about 150° C. are suitably used; preferable examples thereof include polyester- or polyurethane-based adhesives. In order to improve adhesion between the two layers, at least one of the layers may be subjected to silane coupling treatment, titanium coupling treatment, corona treatment, and/or plasma treatment, for example.

Solar Cell

There are no particular limitations on the solar cells used in the solar cell module as long as they can generate electricity by photovoltaic effect of semiconductor. Examples of usable solar cells include silicon (monocrystalline, polycrystalline or amorphous) solar cells, compound semiconductor Group, II-VI Group, etc.) solar cells, dye-sensitized solar cells, and organic semiconductor solar cells. Among them, polycrystalline silicon solar cells are preferable in view of, for example, the balance between power generation performance and production costs.

Silicon solar cells and compound semiconductor solar cells both have superior solar cell characteristics, but are known to be susceptible to breakage by external stress or impact. The encapsulant material for solar cells of the present invention has superior flexibility and thus effectively avoids possible breakage of solar cells by absorbing stress or impact to the solar cells. For this reason, desirably, a layer of the encapsulant material of the present invention is directly bonded to the solar cells in a solar cell module of the present invention.

Moreover, when the encapsulant material has thermal plasticity, the solar cells can be relatively readily removed even after assembling of a solar cell module, thus improving the recycling efficiency of the solar cells. The ethylene resin composition, which is an essential component of the encapsulant material for solar cells of the present invention, has thermal plasticity, and therefore, the encapsulant material also has thermal plasticity as a whole, which is preferably in view of recycling efficiency.

Electrode

There are no particular limitations on the structure and material of electrodes in the solar cell module; in a specific example, the electrode has laminate structure consisting of a transparent conductive film and a metal film. The transparent conductive film is made of $SnO_2$, ITO, ZnO or the like. The metal film is made of metal such as silver, gold, copper, tin, aluminum, cadmium, zinc, mercury, chromium, molybdenum, tungsten, nickel or vanadium. These metals may be used alone or in the form of alloy. The transparent conductive film and metal film are formed by CVD, sputtering, evaporation or the like.

Power Generation Equipment

The solar cell module, a preferred embodiment of the present invention, can be manufactured at high yields, has high power generation efficiency, and has longer life. Accordingly, power generation equipment that includes such a solar cell module is manufactured at low costs and has longer life, and therefore is of high practical value.

The power generation equipment can be used for a long term regardless whether it is used indoor or outdoor (e.g., on the roof of a building, or usage as a portable power source for outdoor activities such as camping or as an auxiliary power source for car batteries).

EXAMPLES

Hereinafter, the present invention will be described in more detail with reference to Examples, which however shall not be construed as limiting the scope of the invention thereto.

[Preparation of Solid Catalyst Component]

A solid catalyst component which contains dimethylsilylene bis(3-methylcyclopentadienyl)zirconium dichloride, a metallocene compound, is prepared in accordance with the procedure described in JP-A No. 09-328520.

Specifically, 3.0 g of silica dried at 250° C. for 10 hours is suspended into 50 ml of toluene and cooled to 0° C. 17.8 ml of methyl aluminoxane in toluene (aluminum=1.29 mmol/ml) is added dropwise over 30 minutes. During addition the temperature of the system is retained at 0° C. The reaction mixture is reacted for 30 minutes at 0° C., heated to 95° C. over 30 minutes, and reacted for 4 hours at that temperature. The reaction solution is cooled to 60° C., and the supernatent is removed by decantation.

The solid content thus obtained is washed with toluene (×2) and resuspended in 50 ml of toluene. To this system is added dropwise 11.1 ml of dimethylsilylenyl bis(3-methylcyclopentadienyl)zirconium dichloride (1:1 diastereomer mixture) in toluene (Zr=0.0103 mmol/ml) over 30 minutes at 20° C. The mixture is heated to 80° C. and reacted for 2 hours at that temperature. The supernatent is removed and the residue is washed with hexane (×2) to afford a solid catalyst containing 2.3 mg of zirconium per gram.

[Preparation of Prepolymerized Catalyst]

A prepolymerized catalyst is prepared also in accordance with the procedure described in JP-A No. 09-328520.

Specifically, 4 g of the solid catalyst prepared above is resuspended into 200 ml of hexane. To this system is added 5.0 ml of triisobutylaluminum in decane (1 mmol/ml) and 0.36 g of 1-hexene, and prepolymerization of ethylene is effected at 35° C. for 2 hours. This affords a prepolymerized catalyst which contains 2.2 mg of zirconium per gram and 3 g of ethylene polymer prepolymerized.

Synthesis of Ethylene Polymer (A)

Polymerization Example 1

A stainless-steel autoclave with an interior volume 2 L, which is fully purged with nitrogen gas, is charged with 800 ml of hexane purified by dehydration, and the system is purged with ethylene/hydrogen mixture gas (hydrogen content: 0.7 mol %).

The system is heated to 60° C. and charged with 1.5 mmol of triisobutylaluminum, 200 ml of 1-hexene, and 0.015 mg in terms of zirconium atom of the above prepolymerized catalyst.

Ethylene/hydrogen mixture gas with the same composition ratio as described above is introduced to a total pressure of 3 MPaG, and polymerization is effected. While supplying the mixture gas to keep the total pressure at 3 MPaG, the polymerization reaction is carried out at 70° C. for 1.5 hours. After the polymerization reaction, the resultant polymer is filtered off and dried at 80° C. overnight to afford 101 g of ethylene polymer (A)1 as a powder.

Ethylene polymer (A)1 is extruded with a single screw extruder from TPIC Co., Ltd. (screw diameter=20 mmφ, L/D=28) at die temperature of 190° C. to produce afford ethylene polymer (A)1', a pellet of ethylene polymer (A)1.

Polymerization Example 2

Ethylene polymer (A)2 is prepared as in Polymerization Example 1 except that the amount of hexane is changed to 795 ml and that the amount of 1-hexene is changed to 205 ml. The yield of ethylene polymer (A)2 is 95 g. Ethylene polymer (A)2 is charged into the single screw extruder, and as in Polymerization Example 1, ethylene polymer (A)2' is produced as a pellet.

Polymerization Example 3

Ethylene polymer (A)3 is prepared as in Polymerization Example 1 except that the hydrogen content in the ethylene/hydrogen mixture gas is changed to 0.5 mol %, that the amount of hexane is changed to 870 ml and that the amount of 1-hexene is changed to 230 ml. The yield of ethylene polymer (A)3 is 130 g. Ethylene polymer (A)3 is charged into the single screw extruder, and as in Polymerization Example 1, ethylene polymer (A)3' is produced as a pellet.

Polymerization Example 4

Ethylene polymer (A)4 is prepared as in Polymerization Example 1 except that the hydrogen content in the ethylene/hydrogen mixture gas is changed to 0.2 mol %, that the amount of hexane is changed to 910 ml and that the amount of 1-hexene is changed to 90 ml. The yield of ethylene polymer (A)4 is 145 g. Ethylene polymer (A)4 is charged into the single screw extruder, and as in Polymerization Example 1, ethylene polymer (A)4' is produced as a pellet.

Polymerization Example 5

Ethylene polymer (A)5 is prepared as in Polymerization Example 1 except that the hydrogen content in the ethylene/hydrogen mixture gas is changed to 0.8 mol %, that the amount of hexane is changed to 780 ml and that the amount of 1-hexene is changed to 220 ml. The yield of ethylene polymer (A)5 is 78 g. Ethylene polymer (A)5 is charged into the single screw extruder, and as in Polymerization Example 1, ethylene polymer (A)5' is produced as a pellet.

Polymerization Example 6

Ethylene polymer (A)6 is prepared as in Polymerization Example 1 except that the hydrogen content in the ethylene/hydrogen mixture gas is changed to 0.2 mol %, that the amount of hexane is changed to 915 ml and that the amount of 1-hexene is changed to 85 ml. The yield of ethylene polymer (A)6 is 146 g. Ethylene polymer (A)6 is charged into the single screw extruder, and as in Polymerization Example 1, ethylene polymer (A)6' is produced as a pellet.

Polymerization Example 7

Ethylene polymer (A)7 is prepared as in Polymerization Example 1 except that the hydrogen content in the ethylene/hydrogen mixture gas is changed to 0.2 mol %, that the amount of hexane is changed to 830 ml and that the amount of 1-hexene is changed to 179 ml. The yield of ethylene polymer (A)7 is 94 g. Ethylene polymer (A)7 is charged into the single screw extruder, and as in Polymerization Example 1, ethylene polymer (A)7' is produced as a pellet.

Polymerization Example 8

Ethylene polymer (A)8 is prepared as in Polymerization Example 7 except that the hydrogen content in the ethylene/hydrogen mixture gas is changed to 0.3 mol %. The yield of ethylene polymer (A)8 is 84 g. Ethylene polymer (A)8 is charged into the single screw extruder, and as in Polymerization Example 1, ethylene polymer (A)8' is produced as a pellet.

Polymerization Example 9

Ethylene polymer (A)9 is prepared as in Polymerization Example 7 except that the hydrogen content in the ethylene/hydrogen mixture gas is changed to 1.0 mol %. The yield of ethylene polymer (A)9 is 145 g. Ethylene polymer (A)9 is charged into the single screw extruder, and as in Polymerization Example 1, ethylene polymer (A)9' is produced as a pellet.

Polymerization Example 10

Ethylene polymer (A)10 is prepared as in Polymerization Example 7 except that the hydrogen content in the ethylene/hydrogen mixture gas is changed to 1.3 mol %. The yield of ethylene polymer (A)10 is 162 g. Ethylene polymer (A)10 is charged into the single screw extruder, and as in Polymerization Example 1, ethylene polymer (A)10' is produced as a pellet.

Polymerization Example 11

Ethylene polymer (A)11 is prepared as in Polymerization Example 7 except that the hydrogen content in the ethylene/hydrogen mixture gas is changed to 1.6 mol % and that the amount of the prepolymerized catalyst (in terms of zirconium atom) is changed to 0.013 mg. The yield of ethylene polymer (A)11 is 151 g. Ethylene polymer (A)11 is charged into the single screw extruder, and as in Polymerization Example 1, ethylene polymer (A)11' is produced as a pellet.

Polymerization Example 12

Ethylene polymer (A)12 is prepared as in Polymerization Example 7 except that the hydrogen content in the ethylene/hydrogen mixture gas is changed to 2.0 mol % and that the amount of the prepolymerized catalyst (in terms of zirconium atom) is changed to 0.012 mg. The yield of ethylene polymer (A)12 is 151 g. Ethylene polymer (A)12 is charged into the single screw extruder, and as in Polymerization Example 1, ethylene polymer (A)12' is produced as a pellet.

Polymerization Example 13

Ethylene polymer (A)13 is prepared as in Polymerization Example 7 except that only ethylene gas is supplied without mixing hydrogen. The yield of ethylene polymer (A)13 is 85 g. Ethylene polymer (A)13 is charged into the single screw extruder, and as in Polymerization Example 1, ethylene polymer (A)13' is produced as a pellet.

Polymerization Example 14

Ethylene polymer (A)14 is prepared as in Polymerization Example 1 except that the amount of hexane is changed to 820 ml, that the amount of 1-hexene is changed to 180 ml, and that the amount of the prepolymerized catalyst (in terms of zirconium atom) is changed to 0.024 mg. The yield of ethylene polymer (A)14 is 125 g. Ethylene polymer (A)14 is charged into the single screw extruder, and as in Polymerization Example 1, ethylene polymer (A)14' is produced as a pellet.

Polymerization Example 15

Ethylene polymer (A)15 is prepared as in Polymerization Example 1 except that the amount of hexane is changed to 830 ml, that the amount of 1-hexene is changed to 170 ml, that the amount of the prepolymerized catalyst (in terms of zirconium atom) is changed to 0.013 mg, and that polymerization time is changed to 0.75 hours. The yield of ethylene polymer (A)15 is 85 g. Ethylene polymer (A)15 is charged into the single screw extruder, and as in Polymerization Example 1, ethylene polymer (A)15' is produced as a pellet.

Polymerization Example 16

5.55 ml of dimethylsilylene bis(3-methylcyclopentadienyl)zirconium dichloride in toluene (Zr=0.0103 mmol/ml), a solid catalyst component prepared in the manner as described above, and 5.55 ml of bis(3-methylcyclopentadienyl)zirconium dichloride in toluene (Zr=0.0103 mmol/ml), a commercially available solid catalyst component, are mixed to produce a solid catalyst component. Prepolymerization is carried out using the catalyst component thus obtained to produce a prepolymerized catalyst.

Ethylene polymer (A)16 is then prepared as in Polymerization Example 1 except that the amount of hexane is changed to 820 ml, that the amount of 1-hexene is changed to 180 ml, that the prepolymerized catalyst prepared above is used in an amount of in terms of zirconium atom of 0.017 mg, and that polymerization time is changed to 3 hours. The yield of ethylene polymer (A)16 is 165 g. Ethylene polymer (A)16 is charged into the single screw extruder, and as in Polymerization Example 1, ethylene polymer (A)16' is produced as a pellet.

Polymerization Example 17

Ethylene polymer (A)17 is prepared as in Polymerization Example 1 except that the hydrogen content in the ethylene/hydrogen mixture gas is changed to 0.8 mol %, that the amount of hexane is changed to 750 ml, that the amount of 1-hexene is changed to 250 ml, that the amount of the prepolymerized catalyst (in terms of zirconium atom) is changed to 0.008 mg, and that the total pressure is changed to 4 MPaG. The yield of ethylene polymer (A)17 is 150 g. Ethylene polymer (A)17 is charged into the single screw extruder, and as in Polymerization Example 1, ethylene polymer (A)17' is produced as a pellet.

Polymerization Example 18

Ethylene polymer (A)18 is prepared as in Polymerization Example 1 except that the hydrogen content in the ethylene/hydrogen mixture gas is changed to 0.2 mol %, that the amount of hexane is changed to 950 ml, that the amount of 1-hexene is changed to 50 ml, that the amount of the prepolymerized catalyst (in terms of zirconium atom) is changed to 0.045 mg, and that the total pressure is changed to 1.2 MPaG. The yield of ethylene polymer (A)18 is 80 g. Ethylene polymer (A)18 is charged into the single screw extruder, and as in Polymerization Example 1, ethylene polymer (A)18' is produced as a pellet.

Polymerization Example 19

Polymerization is carried out as in Polymerization Example 1 except that the hydrogen content in the ethylene/hydrogen mixture gas is changed to 0.8 mol %, that the amount of hexane is changed to 750 ml, that the amount of 1-hexene is changed to 250 ml, that the amount of the prepolymerized catalyst (in terms of zirconium atom) is changed to 0.008 mg, and that the total pressure is changed to 4 MPaG. 5 ml of 1N hydrochloric acid and 500 ml of distilled water are added to the polymer solution for decalsification, followed by separation of water. The obtained polymer is washed with distilled water until the pH of the collected water becomes neutralized. A polymer is filtered off and dried at 80° C. overnight to afford ethylene polymer (A)19. The yield of ethylene polymer (A)19 is 150 g. Ethylene polymer (A)19 is charged into the single screw extruder, and as in Polymerization Example 1, ethylene polymer (A)19' is produced as a pellet.

Polymerization Example 20

Ethylene polymer (A)20 is prepared as in Polymerization Example 1 except that the hydrogen content in the ethylene/hydrogen mixture gas is changed to 0.2 mol %, that the amount of hexane is changed to 945 ml, that the amount of 1-hexene is changed to 55 ml, that the amount of the prepolymerized catalyst (in terms of zirconium atom) is changed to 0.055 mg, and that the total pressure is changed to 1 MPaG. The yield of ethylene polymer (A)20 is 70 g. Ethylene polymer (A)20 is charged into the single screw extruder, and as in Polymerization Example 1, ethylene polymer (A)20' is produced as a pellet.

Polymerization Example 21

Ethylene polymer (A)21 is prepared as in Polymerization Example 7 except that the hydrogen content in the ethylene/hydrogen mixture gas is changed to 0.7 mol %. The yield of ethylene polymer (A)21 is 105 g. Ethylene polymer (A)21 is charged into the single screw extruder, and as in Polymerization Example 1, ethylene polymer (A)21' is produced as a pellet.

Ethylene polymers (A) prepared in Polymerization Examples 1 to 21 are measured for their a) density, b) peak melt temperature, c) MFR2, d) molecular weight distribution (Mw/Mn), and e) metal residue content as will be described below.

(a) Density

A strand of ethylene polymer (A) subjected measurement of melt flow rate at 190° C. and a load of 2.16 kg (MFR2) is allowed to cool to room temperature over 1 hour. The density of the strand is then measured with a density gradient tube method.

(b) Peak Melt Temperature

A DSC aluminum sample pan is loaded with approximately 5 mg of ethylene polymer (A) and, in a differential scanning calorimeter (PerkinElmer DSC7), heated from 0° C. to 200° C. at a heating rate of 320° C./min, retained at 200° C. for 5 minutes, cooled from 200° C. to 0° C. at a cooling rate of 10° C./min, retained at 0° C. for 5 minutes, and heated at a heating rate of 10° C./min. The peak top temperature in the obtained DSC endothermic curve is defined as peak melt temperature. it should be noted that when multiple peaks appeared by DSC, the endothermic peak observed at the highest temperature is employed as peak melt temperature (Tm).

c) MFR2

MFR2 is measured in accordance with JIS K-6721 at 190° C. and a load of 2.16 kg.

d) Molecular Weight Distribution (Mw/Mn)

The molecular weight distribution (Mw/Mn) is measured on a gel permeation chromatograph using Waters Alliance GPC 2000 under the following conditions:

Separation columns: TSKgel GNH6-HT (×2), SKgel GNH6-HTL (×2)

Column size: 7.5 mm in diameter and 300 mm in length

Column temperature: 140° C.

Mobile phase: o-dichlorobenzene (Wako Pure Chemical Industries, Ltd.) with 0.025 wt % antioxidant BHT (Takeda Pharmaceutical Company Ltd.)

Mobile phase flow rate: 1.0 ml/min

Sample concentration: 15 mg/10 ml

Sample injection volume: 500 μl

Detector: differential refractometer

Standard polystyrenes (Mw<1000, Mw>4×10$^6$): standard polystyrene available from Tosoh Corporation Standard polystyrene (100M≤Mw≤4×10$^6$): standard polystyrene available from Pressure Chemical Company (e) Metal Residue Content Ethylene polymer (A) is decomposed by wet process and diluted with pure water to a given final volume, and the amounts of aluminum, zirconium, titanium, hafnium and magnesium are quantified with an ICP emission spectrometer (ICPS-8100, Shimadzu Corporation). The total amount of the metal elements is defined as metal residue content.

Physical properties of ethylene polymers (A) prepared in Polymerization Examples 1 to 6 are shown in Table 1, physical properties of ethylene polymers (A) prepared in Polymerization Examples 7 to 13 are shown in Table 2, and physical properties of ethylene polymers (A) prepared in Polymerization Examples 7 to 13 are shown in Table 2.

TABLE 1

|  | Ethylene polymer (A) 1' | Ethylene polymer (A) 2' | Ethylene polymer (A) 3 | Ethylene polymer (A) 3' | Ethylene polymer (A) 4' | Ethylene polymer (A) 5' | Ethylene polymer (A) 6' |
| --- | --- | --- | --- | --- | --- | --- | --- |
| Density [kg/m$^3$] | 903 | 901 | 922 | 922 | 939 | 897 | 942 |
| Peak melt temp [° C.] | 98 | 96 | 121 | 121 | 124 | 88 | 126 |
| MFR2 [g/10 min] | 3.8 | 3.5 | 3.3 | 3.5 | 3.6 | 3.5 | 3.5 |
| Mw/Mn | 2.1 | 2.1 | 2.1 | 2.1 | 2.1 | 2.1 | 2.1 |
| Metal residue [ppm] | 10 | 11 | 8 | 8 | 7 | 13 | 7 |

TABLE 2

|  | Ethylene polymer (A) 7' | Ethylene polymer (A) 8' | Ethylene polymer (A) 9' | Ethylene polymer (A) 10' | Ethylene polymer (A) 11' | Ethylene polymer (A) 12' | Ethylene polymer (A) 13' |
| --- | --- | --- | --- | --- | --- | --- | --- |
| Density [kg/m$^3$] | 910 | 911 | 910 | 911 | 911 | 912 | 908 |
| Peak melt temp [° C.] | 109 | 110 | 109 | 110 | 110 | 112 | 107 |
| MFR2 [g/10 min] | 0.1 | 0.5 | 19 | 48 | 97 | 150 | 0.07 |
| Mw/Mn | 2.2 | 2.1 | 2.0 | 2.0 | 2.0 | 2.0 | 2.2 |
| Metal residue [ppm] | 11 | 12 | 7 | 6 | 6 | 6 | 12 |

TABLE 3

|  | Ethylene polymer (A) 14' | Ethylene polymer (A) 15' | Ethylene polymer (A) 16' | Ethylene polymer (A) 17' | Ethylene polymer (A) 18' | Ethylene polymer (A) 19' | Ethylene polymer (A) 20' | Ethylene polymer (A) 21' |
| --- | --- | --- | --- | --- | --- | --- | --- | --- |
| Density [kg/m$^3$] | 911 | 912 | 909 | 908 | 911 | 910 | 909 | 910 |
| Peak melt temp [° C.] | 110 | 112 | 108 | 107 | 110 | 109 | 108 | 109 |
| MFR2 [g/10 min] | 3.5 | 3.6 | 3.5 | 3.5 | 3.6 | 3.6 | 3.6 | 10 |
| Mw/Mn | 2.7 | 1.7 | 3.8 | 2.0 | 2.0 | 2.2 | 2.1 | 2.1 |
| Metal residue [ppm] | 10 | 11 | 13 | 0.2 | 38 | 0.04 | 53 | 7 |

Example 1

100 weight parts of ethylene polymer (A)1', 1.5 weight parts of vinyl methoxysilane as ethylenically-unsaturated silane compound (B)1, 0.05 weight parts of 2,5-dimethyl-2,5-di(t-butylperoxy)hexane as organic peroxide 1, 0.4 weight parts of 2-hydroxy-4-n-octyloxybenzophenone as UV absorber (D), 0.1 weight parts of bis(2,2,6,6-tetramethyl-4-piperidyl)sebacate as radical scavenger (E), and 0.1 weight parts of tris(2,4-di-tert-buthylphenyl)phosphite as heat resistance stabilizer (F) are mixed and further dry-blended to produce an ethylene polymer blend.

The ethylene polymer blend is melt-kneaded with a single screw extruder from TPIC Co., Ltd. (screw diameter=20 mmφ, L/D=28), extruded from a coat hanger-type T-die (lip shape; 270×0.8 mm) at die temperature of 210° C., cooled at room temperature of 30° C., and taken up on first chill roll at a take up rate of 1.0 m/min using an embossing roll. This affords a sheet made of the ethylene resin composition containing a modified product of ethylene polymer (A)1' modified with ethylenically-unsaturated silane compound (B)1. The sheet's maximum thickness $t_{max}$ is 500 μm. The sheet is embossed and has porosity P of 28%.

The sheet is evaluated for the characteristics below, results of which are shown in Table 4.

Grafted Silane Amount

The sheet obtained above (made of ethylene resin composition) is extracted by Soxhlet with acetone to prepare a sheet sample; The sheet sample is decomposed by wet process, diluted with pure water to a given final volume, and subjected to quantification of silicon (Si) with an ICP emission spectrometer (ICPS-8100, Shimadzu Corporation).

Amount of Free Silane Derived from Remaining Ethylenically-Unsaturated Silane Compound The sheet obtained above (sheet made of ethylene resin composition) is decomposed by wet process, diluted with pure water to a given final volume, and subjected to quantification of total silicon (Si) amount with an ICP emission spectrometer (ICPS-8100, Shimadzu Corporation). The grafted amount of silica is subtracted from the total silica amount to find "remaining amount of ethylenically-unsaturated silane compound." The percentage ratio of amount of silica derived from remaining ethylenically-unsaturated silane compound to total silica amount is calculated to find "free silica content."

Adhesion Strength

A 0.5 mmm-thick sheet sample is sandwiched between an ozone-treated polyethylene terephthalate backsheet ("LIP-TEA" Lintec Corporation) and a glass plate on which silver is deposited on the center by sputtering (hereinafter simply referred to as a "thin-film electrode). The stack is placed on a hot plate set at 150° C. in a vacuum laminator, laminated under vacuum for 2 minutes, and heated for 13 minutes. In this way a thin-film electrode-deposited glass/sheet sample/backsheet stack is fabricated.

The stack is cut to a width of 15 mm, and a 180 degree peel strength to each module component (backsheet, thin-film electrode or glass) is measured.

The 180 degree peel test is conducted at 23° C. with Instron 1123 tensile tester at a 30 mm span and a 30 mm/min crosshead speed, and an average of three measured values is defined as "adhesion strength."

Constant Temperature/Humidity Test

The edges of the stack fabricated in the adhesion strength test above are sealed with butyl rubber, and the exterior is covered with an aluminum frame to prepare a dummy module. The dummy module is subjected to a 2,000 hour-acceleration test in accordance with JIS C8917 using custom-made XL75 (Suga Test Instruments Co., Ltd.) at a chamber internal temperature of 85° C. and a humidity of 85%. After the acceleration test, the stack is taken out from the machine, followed by measurement of the sheet sample's adhesion strength to glass. Adhesion strength retention ratio indicates a ratio with respect to the initial adhesion strength (adhesion strength before acceleration test).

High-intensity Xenon Exposure Test

The edges of the stack fabricated in the adhesion strength test above are sealed with butyl rubber, and the exterior is covered with an aluminum frame to prepare a dummy module. The dummy module is subjected to a 2,000 hour-acceleration test in accordance with JIS C8917 using custom-made XL75 (Suga Test Instruments Co., Ltd.) at black panel temperature (BPT) of 83° C. and a humidity of 85%. After the acceleration test, the stack is taken out from the machine, followed by measurement of the sheet sample's adhesion strength to glass. Adhesion strength retention ratio indicates a ratio with respect to the initial adhesion strength (adhesion strength before acceleration test).

Heat Cycle Test

The edges of the stack fabricated in the adhesion strength test above are sealed with butyl rubber, and the exterior is covered with an aluminum frame to prepare a dummy module. The dummy module is subjected to a 1200 hour-acceleration test in accordance with JIS C8917 using custom-made XL75 (Suga Test Instruments Co., Ltd.), by conducting 200 six-hour cycles consisting of: raising the chamber internal temperature from −40° C. to 90° C. over 2 hours; retaining the temperature at 90° C. for 1 hour; dropping the temperature from 90° C. to −40° C. over 2 hours; and retaining the temperature at −40° C. for 1 hour. After the acceleration test, the stack is taken out from the machine, followed by measurement of the sheet sample's adhesion strength to glass. Adhesion strength retention ratio indicates a ratio with respect to the initial adhesion strength (adhesion strength before acceleration test).

Dielectric Breakdown Strength

Dielectric breakdown strength is measured in accordance with JIS-K6911 at 23° C. using a 0.4 mm-thick specimen. A specimen in sheet form is fabricated under a pressure of 100 MPa using a hydraulic hot press set at 200° C. (SHINTO Metal Industries Corporation). In the case of a 0.4 mm-thick sheet (spacer shape; four spacers having a size of 80×80×0.5 to 3 mm on a plate having a size of 240×240×2 mm), the specimen is pre-heated on the hot press set at 200° C. for about 2 minutes and then pressed under a pressure of 10 MPa. Thereafter, using another hydraulic hot press set at 20° C. (SHINTO Metal Industries Corporation), the sheet is compressed at 10 MPa and cooled for about 3 minutes to prepare a sample for measurement. A 5 mm-thick brass plate is used as the hot plate.

Gel Fraction 1 g of sample is collected from the extruded sheet, extracted by Soxhlet with boiling xylene for 10 hours, and filtrated through a stainless steel mesh (size 30). The mesh is dried under vacuum at 110° C. for 8 hours, and the amount of sample remaining on the mesh is measured.

Moisture Permeability

Using a 0.5 mm-thick specimen, moisture permeability is measured in accordance with JIS-Z0208 and JIS-K7129 with the dish method at 23° C. and at 90% humidity.

Electrode Corrosiveness

A 0.5 mm-thick sheet sample is sandwiched between a pair of glass plates on which silver is deposited on the center by sputtering (hereinafter simply referred to as "thin-film electrode"). The stack is placed on a hot plate set at 150° C. in a vacuum laminator, laminated under vacuum for 2 minutes, and heated for 13 minutes. In this way a thin-film electrode-deposited glass/sheet sample/thin-film electrode-deposited glass stack is fabricated. The stack is subjected to the above constant temperature/humidity test, and the state of the silver electrodes are visually observed and evaluated based on the following criteria:

A: No change due to corrosion
B: Slight change due to corrosion
C: Electrode turned ginger due to corrosion Solid Viscoelasticity An extruded sheet (emboss pattern: one side surface, maximum thickness $t_{max}$: 500 μm) is cut into a strip (3 mm width× 30 mm length) to prepare a specimen. The storage modulus of the specimen is measured from −70° C. to a measurable temperature range with RSA-II (TA Instruments, Inc.) at the frequency of 1 Hz and the heating rate of 3° C./min under a nitrogen atmosphere, to find storage modulus (E') at 80° C.

Porosity P

Apparent volume (mm$^3$) of an extruded sheet (sheet with an emboss pattern on one side and has a maximum thickness $t_{max}$ of 500 μm) is found by multiplying maximum thickness $t_{max}$ (mm) of encapsulant sheet 1 by unit area (e.g., 1 mm$^2$=1,000×1,000=10$^6$ mm$^2$) as follows:

$$V_A(\text{mm}^3) = t_{max}(\text{mm}) \times 10^6(\text{mm}^2) \quad (1)$$

On the other hand, the actual volume $V_0$ (mm$^3$) of the encapsulant material per unit area is calculated by substituting ρ (specific gravity (g/mm$^3$) of resin constituting the encapsulant material) and W (actual weight (g) of the encapsulant material per unit area (1 m$^2$) into the following equation (2):

$$V_0(\text{mm}^3) = W/\rho \quad (2)$$

The total volume $V_H$ (mm$^3$) of concaved portions per unit area of the encapsulant material is found by subtracting "actual volume" ($V_0$) from "apparent volume ($V_A$)" as shown in the following equation (3):

$$V_H(\text{mm}^3) = V_A - V_0 = V_A - (W/\rho) \quad (3)$$

Porosity (P) is then found using the following equation:

$$\text{Porosity } P(\%) = V_H/V_A \times 100 = (V_A - (W/\rho))/V_A \times 100 = 1 - W/(\rho \cdot V_A) \times 100 = 1 - W/(\rho \cdot t_{max} \times 10^6) \times 100$$

Long-term Storage Test

A sheet sample of encapsulant material which is embossed on one side surface and has a maximum thickness $t_{max}$ of 500 μm is prepared. The sheet sample is placed into a 100 μm-thick polyethylene bag, and the opening of the bag is closed by heat sealing. The sheet sample is stored for 6 months at room temperature in this state. Using the sheet sample after the storage test, a thin-film electrode-deposited glass/sheet sample/backsheet stack is fabricated. A 180 degree peel strength of the sheet sample to the backsheet is measured.

Example 2

A polymer blend is produced as in Example 1 except that ethylene polymer (A)1' is changed to ethylene polymer (A)2', and a sheet is molded from the polymer blend. The sheet is evaluated as described above, results of which are shown in Table 4.

Example 3

A polymer blend is produced as in Example 1 except that ethylene polymer (A)1' is changed to ethylene polymer (A)3' and that the amount of tris(2,4-di-tert-butylphenyl)phosphite, heat resistance stabilizer (F), is changed to 0.05 weight parts, and then a sheet is molded from the polymer blend. The sheet is evaluated as described above, results of which are shown in Table 4.

Example 4

A polymer blend is produced as in Example 1 except that ethylene polymer (A)1' is changed to ethylene polymer (A)4' and that the amount of tris(2,4-di-tert-butylphenyl)phosphite, heat resistance stabilizer (F), is changed to 0.2 weight parts, and then a sheet is molded from the polymer blend. The sheet is evaluated as described above, results of which are shown in Table 4.

is sticky and firmly adhered to the first chill roll; therefore, it is difficult to produce a 500 μm-thick sheet steadily. Moreover, sheet blocking is so significant that unrolling is difficult. The sheet is evaluated as described above. The sheet has low initial adhesion strength, as well as reduced adhesion strength retention after the constant temperature/humidity test, high-intensity xenon exposure test and heat cycle test. Results are shown in Table 4.

Comparative Example 2

A polymer blend is produced as in Example 1 except that ethylene polymer (A)1' is changed to ethylene polymer (A)6' and that the amount of tris(2,4-di-tert-butylphenyl)phosphite, heat resistance stabilizer (F), is changed to 0.02 weight parts, and then a sheet is molded from the polymer blend. The sheet is evaluated as described above. As a result, under the lamination process condition, the ethylene resin composition is hard to melt, failing to exert initial adhesion. Results are shown in Table 4.

TABLE 4

| | | Ex. 1 | Ex. 2 | Ex. 3 | Ex. 4 | Comp. Ex. 1 | Comp. Ex. 2 |
|---|---|---|---|---|---|---|---|
| Ethylene polymer (A)1' | | 100 | | | | | |
| Ethylene polymer (A)2' | | | 100 | | | | |
| Ethylene polymer (A)3' | | | | 100 | | | |
| Ethylene polymer (A)4' | | | | | 100 | | |
| Ethylene polymer (A)5' | | | | | | 100 | |
| Ethylene polymer (A)6' | | | | | | | 100 |
| Ethylenically-unsaturated silane compound (B)1 | | 1.5 | 1.5 | 1.5 | 1.5 | 1.5 | 1.5 |
| Organic peroxide 1 | | 0.05 | 0.05 | 0.05 | 0.05 | 0.05 | 0.05 |
| UV absorber (D) | | 0.4 | 0.4 | 0.4 | 0.4 | 0.4 | 0.4 |
| Radical scavenger (E) | | 0.1 | 0.1 | 0.1 | 0.1 | 0.1 | 0.1 |
| Heat resistance stabilizer (F) | | 0.1 | 0.1 | 0.05 | 0.2 | 0.2 | 0.02 |
| Grafted silane amount (ppm) | | 2100 | 2120 | 2130 | 2110 | 2090 | 2060 |
| Initial adhesion strength to glass [N/cm] | | 17.3 | 15.7 | 18.4 | 15.8 | 14.4 | 12.5 |
| Adhesion strength to backsheet [N/cm] | | 17.4 | 16.7 | 18.1 | 17.1 | 15.3 | 15.1 |
| Adhesion strength to thin-film electrode [N/cm] | | 16.8 | 15.4 | 18.1 | 15.4 | 14.1 | 12.4 |
| Constant temp./humidity test 85° C. × 85% Rh, 2000 h | Adhesion strength To glass [N/cm] | 14.5 | 12.5 | 16.0 | 14.2 | 10.1 | 10.4 |
| | Retention ratio [%] | 84 | 80 | 87 | 90 | 70 | 83 |
| High-intensity xenon exposure test BPT83° C. no rain 2000 h | Adhesion strength To glass [N/cm] | 14.3 | 12.6 | 15.8 | 13.9 | 9.8 | 10.2 |
| | Retention ratio [%] | 83 | 80 | 86 | 88 | 68 | 82 |
| Heat cycle test −40° C. to 90° C. 200 cycles (1200 h) | Adhesion strength To glass [N/cm] | 14.3 | 12.5 | 15.7 | 14.1 | 9.4 | 10.5 |
| | Retention ratio [%] | 83 | 80 | 85 | 89 | 65 | 84 |
| Dielectric breakdown strength [kV/mm] | | 75 | 75 | 76 | 75 | 74 | 71 |
| Gel fraction [%] | | 5 | 4 | 17 | 28 | 2 | 31 |
| State of thin-film electrodes after lamination | | Good | Good | Good | Good | Good | Cracks |

Comparative Example 1

A polymer blend is produced as in Example 1 except that ethylene polymer (A)1' is changed to ethylene polymer (A)5' and that the amount of tris(2,4-di-tert-butylphenyl)phosphite, heat resistance stabilizer (F), is changed to 0.2 weight parts, and then a sheet is molded from the polymer blend. The sheet

Example 5

A polymer blend is produced as in Example 1 except that ethylene polymer (A)1' is changed to a mixture of 90 weight parts of ethylene polymer (A)1' and 10 weight parts of ethylene polymer (A)3, and then a sheet is molded from the polymer blend. The sheet is evaluated as described above, results of which are shown in Table 5.

Example 6

A polymer blend is produced as in Example 1 except that ethylene polymer (A)1' is changed to a mixture of 98 weight parts of ethylene polymer (A)1' and 2 weight parts of ethylene polymer (A)3 and that the amount of tris(2,4-di-tert-butylphenyl)phosphite, heat resistance stabilizer (F), is changed to 0.05 weight parts, and then a sheet is molded from the polymer blend. The sheet is evaluated as described above, results of which are shown in Table 5.

Example 7

80 weight parts of ethylene polymer (A)3, 1.5 weight parts of vinyl methoxysilane as ethylenically-unsaturated silane compound (B)1, 0.05 weight parts of 2,5-dimethyl-2,5-di(t-butylperoxy)hexane as organic peroxide 1, 0.4 weight parts of 2-hydroxy-4-n-octyloxybenzophenone as UV absorber (D), 0.1 weight parts of bis(2,2,6,6-tetramethyl-4-piperidyl)sebacate as radical scavenger (E), and 0.1 weight parts of tris(2, 4-di-tert-buthylphenyl)phosphite as heat resistance stabilizer (F) are dry-blended, and is melt-kneaded with a single screw extruder from TPIC Co., Ltd. (screw diameter=20 mm φ, L/D=28) at a die temperature of 210° C. to produce a modified product of ethylene polymer (A)3. A sheet is produced as in Example 1 except that an ethylene polymer blend is produced by dry-blending of the modified product of ethylene polymer (A)3 with 20 weight parts of ethylene polymer (A)1' pellet. The sheet is evaluated as described above, results of which are shown in Table 5.

Example 8

A polymer blend is produced as in Example 1 except that ethylene polymer (A)1' is changed to ethylene polymer (A)3 and that the amount of tris(2,4-di-tert-butylphenyl)phosphite, heat resistance stabilizer (F), is changed to 0.2 weight parts, and then a sheet is molded from the polymer blend. The sheet is evaluated as described above, results of which are shown in Table 5.

TABLE 5

|  |  | Ex. 5 | Ex. 6 | Ex. 7 | Ex. 8 |
|---|---|---|---|---|---|
| Ethylene polymer (A)1' | | 90 | 98 | 20 | |
| Ethylene polymer (A)3 | | 10 | 2 | 80 | 100 |
| Ethylenically-unsaturated silane compound (B)1 | | 1.5 | 1.5 | 1.5 | 1.5 |
| Organic peroxide 1 | | 0.05 | 0.05 | 0.05 | 0.05 |
| UV absorber (D) | | 0.4 | 0.4 | 0.4 | 0.4 |
| Radical scavenger (E) | | 0.1 | 0.1 | 0.1 | 0.1 |
| Heat resistance stabilizer (F) | | 0.1 | 0.05 | 0.2 | 0.2 |
| Grafted silane amount (ppm) | | 2100 | 2150 | 2130 | 2050 |
| Initial adhesion strength to glass [N/cm] | | 17.5 | 17.9 | 16.9 | 17.5 |
| Adhesion strength to backsheet [N/cm] | | 17.5 | 17.5 | 17.2 | 17.5 |
| Adhesion strength to thin-film electrode [N/cm] | | 17.2 | 17.5 | 16.4 | 17.1 |
| Constant temp./humidity test 85° C. × 85% Rh, 2000 h | Adhesion strength to glass [N/cm] | 14.7 | 15.0 | 15.1 | 14.5 |
|  | Adhesion strength Retention [%] | 84 | 84 | 89 | 83 |
| High-intensity xenon exposure test BPT83° C. no rain 2000 h | Adhesion strength to glass [N/cm] | 14.5 | 14.7 | 14.0 | 14.2 |
|  | Adhesion strength Retention [%] | 83 | 82 | 83 | 81 |
| Heat cycle test −40° C. to 90° C. 200 cycles (1200 h) | Adhesion strength to glass [N/cm] | 14.3 | 14.6 | 13.8 | 14.1 |
|  | Adhesion strength Retention [%] | 82 | 82 | 82 | 81 |
| Dielectric breakdown strength [kV/mm] | | 75 | 75 | 75 | 76 |
| Gel fraction [%] | | 0.5 or less | 0.5 or less | 0.5 or less | 0.5 or less |

Examples 9 to 13

Polymer blends are produced as in Example 1 except that the type of ethylene polymer (A) and the amount of tris(2,4-di-tert-butylphenyl)phosphite, heat-resistance stabilizer (F), are changed as shown in Table 6, and then sheets are molded from the respective polymer blends. The sheets are evaluated as described above, results of which are shown in Table 6.

Comparative Example 3

A polymer blend is produced as in Example 1 except that ethylene polymer (A) is changed as shown in Table 6, and a sheet is molded from the polymer blend. However, the sheet does not have body as well as is so sticky that it firmly adheres to the first chill roll, failing to produce a sheet with a uniform thickness of 500 μm. Thus, evaluation of adhesion is unavailable. Results are shown in Table 6.

Comparative Example 4

A polymer blend is produced as in Example 1 except that ethylene polymer (A) is changed as shown in Table 6, and a sheet is molded from the polymer blend. However, the extruder's torque becomes too high to perform sheet extrusion, thus failing to mold a sheet. Results are shown in Table 6.

Examples 14 and 15

Polymer blends are produced as in Example 1 except that the type of ethylene polymer (A) and the amount of tris(2,4-di-tert-butylphenyl)phosphite, heat-resistance stabilizer (F), are changed as shown in Table 7, and then sheets are molded from the respective polymer blends. The sheets are evaluated as described above, results of which are shown in Table 7.

Comparative Example 5

A polymer blend is produced as in Example 1 except that the type of ethylene polymer (A) and the amount of tris(2,4-di-tert-butylphenyl)phosphite, heat-resistance stabilizer (F), are changed as shown in Table 7, and a sheet is molded from the polymer blend. However, the sheet is so sticky that it firmly adheres to the first chill roll, failing to produce a sheet with a uniform thickness of 500 μm. Thus, evaluation of adhesion is unavailable. Results are shown in Table 7.

Examples 16 and 17

Polymer blends are produced as in Example 1 except that the type of ethylene polymer (A) and the amount of tris(2,4-di-tert-butylphenyl)phosphite, heat-resistance stabilizer (F), are changed as shown in Table 8, and then sheets are molded from the respective polymer blends. The sheets are evaluated as described above, results of which are shown in Table 8.

Comparative Example 6

A polymer blend is produced as in Example 1 except that the type of ethylene polymer (A) and the amount of tris(2,4-di-tert-butylphenyl)phosphite, heat-resistance stabilizer (F), are changed as shown in Table 8, and a sheet is molded from the polymer blend. The sheet is evaluated as described above, results of which are shown in Table 8. A trace of acid for the decalcification remains in the sheet, which corrodes the silver electrode. Moreover, the molded sheet has low initial adhesion strength, as well as reduced adhesion strength retention after the constant temperature/humidity test, high-intensity xenon exposure test and heat cycle test.

TABLE 6

| | | Ex. 9 | Ex. 10 | Ex. 11 | Ex. 12 | Ex. 13 | Comp. Ex. 3 | Comp. Ex. 4 |
|---|---|---|---|---|---|---|---|---|
| Ethylene polymer (A)7' | | 90 | | | | | | |
| Ethylene polymer (A)8' | | | 90 | | | | | |
| Ethylene polymer (A)9' | | | | 90 | | | | |
| Ethylene polymer (A)10' | | | | | 90 | | | |
| Ethylene polymer (A)11' | | | | | | 90 | | |
| Ethylene polymer (A)12' | | | | | | | 90 | |
| Ethylene polymer (A)13' | | | | | | | | 100 |
| Ethylene polymer (A)3 | | 10 | 10 | 10 | 10 | 10 | 10 | |
| Ethylenically-unsaturated silane compound (B)1 | | 1.5 | 1.5 | 1.5 | 1.5 | 1.5 | 1.5 | 1.5 |
| Organic peroxide 1 | | 0.05 | 0.05 | 0.05 | 0.05 | 0.05 | 0.05 | 0.05 |
| UV absorber (D) | | 0.4 | 0.4 | 0.4 | 0.4 | 0.4 | 0.4 | 0.4 |
| Radical scavenger (E) | | 0.1 | 0.1 | 0.1 | 0.1 | 0.1 | 0.1 | 0.1 |
| Heat resistance stabilizer (F) | | 0.1 | 0.05 | 0.2 | 0.05 | 0.2 | 0.2 | 0.02 |
| Grafted silane amount (ppm) | | 2130 | 2100 | 2120 | 2110 | 2160 | 2050 | 2100 |
| Initial adhesion strength to glass [N/cm] | | 18.9 | 18.4 | 17.2 | 16.4 | 15.2 | N.A. | N.A. |
| Adhesion strength to backsheet [N/cm] | | 18.3 | 18.2 | 17.5 | 17.1 | 16.7 | | |
| Adhesion strength to thin-film electrode [N/cm] | | 18.7 | 18.1 | 16.8 | 16.2 | 14.8 | | |
| Constant temp./humidity test 85° C. × 85% Rh, 2000 h | Adhesion strength to glass [N/cm] | 15.5 | 15.1 | 13.8 | 13.7 | 12.6 | | |
| | Adhesion strength Retention [%] | 82 | 82 | 80 | 84 | 83 | | |
| High-intensity xenon exposure test BPT83° C. no rain 2000 h | Adhesion strength to glass [N/cm] | 15.4 | 15.0 | 13.9 | 13.4 | 12.7 | | |
| | Adhesion strength Retention [%] | 81 | 82 | 81 | 82 | 84 | | |
| Heat cycle test −40° C. to 90° C. 200 cycles (1200 h) | Adhesion strength to glass [N/cm] | 15.3 | 14.9 | 13.9 | 13.2 | 12.7 | | |
| | Adhesion strength Retention [%] | 81 | 81 | 81 | 80 | 84 | | |
| Dielectric breakdown strength [kV/mm] | | 76 | 77 | 76 | 76 | 76 | 76 | 76 |
| Gel fraction [%] | | 0.5 or less | 0.5 or less | 0.5 or less | 0.5 or less | 0.5 or less | 0.5 or less | 0.5 or less |

TABLE 7

| | Ex. 14 | Ex. 15 | Comp. Ex. 5 |
|---|---|---|---|
| Ethylene polymer (A)14' | 90 | | |
| Ethylene polymer (A)15' | | 90 | |
| Ethylene polymer (A)16' | | | 90 |
| Ethylene polymer (A)3 | 10 | 10 | 10 |

TABLE 7-continued

|  |  | Ex. 14 | Ex. 15 | Comp. Ex. 5 |
|---|---|---|---|---|
| Ethylenically-unsaturated silane compound (B)1 |  | 1.5 | 1.5 | 1.5 |
| Organic peroxide 1 |  | 0.05 | 0.05 | 0.05 |
| UV absorber (D) |  | 0.4 | 0.4 | 0.4 |
| Radical scavenger (E) |  | 0.1 | 0.1 | 0.1 |
| Heat resistance stabilizer (F) |  | 0.1 | 0.05 | 0.02 |
| Grafted silane amount (ppm) |  | 2100 | 2100 | 2100 |
| Initial adhesion strength to glass [N/cm] |  | 18.1 | 18.0 | N.A. |
| Adhesion strength to backsheet [N/cm] |  | 17.9 | 17.9 |  |
| Adhesion strength to thin-film electrode [N/cm] |  | 17.7 | 17.6 |  |
| Constant temp./ humidity test 85° C. × 85% Rh, 2000 h | Adhesion strength to glass [N/cm] | 14.6 | 14.7 |  |
|  | Adhesion strength Retention [%] | 81 | 82 |  |
| High-intensity xenon exposure test BPT83° C. no rain 2000 h | Adhesion strength to glass [N/cm] | 14.7 | 14.8 |  |
|  | Adhesion strength Retention [%] | 81 | 82 |  |
| Heat cycle test −40° C. to 90° C. 200 cycles (1200 h) | Adhesion strength to glass [N/cm] | 14.8 | 14.7 |  |
|  | Adhesion strength Retention [%] | 82 | 82 |  |
| Dielectric breakdown strength [kV/mm] |  | 75 | 76 | 76 |
| Gel fraction [%] |  | 0.5 or less | 0.5 or less | 0.5 or less |
| Moldability [—] |  | Easily molded | Easily molded | Sticky sheet surface |

TABLE 8

|  |  | Ex. 16 | Ex. 17 | Comp. Ex. 6 | Comp. Ex. 7 |
|---|---|---|---|---|---|
| Ethylene polymer (A)17' |  | 90 |  |  |  |
| Ethylene polymer (A)18' |  |  | 90 |  |  |
| Ethylene polymer (A)19' |  |  |  | 100 |  |
| Ethylene polymer (A)20' |  |  |  |  | 100 |
| Ethylene polymer (A)3 |  | 10 | 10 |  |  |
| Ethylenically-unsaturated silane compound (B)1 |  | 2 | 2 | 2 | 2 |
| Organic peroxide 1 |  | 0.05 | 0.05 | 0.05 | 0.05 |
| UV absorber (D) |  | 0.4 | 0.4 | 0.4 | 0.4 |
| Radical scavenger (E) |  | 0.1 | 0.1 | 0.1 | 0.1 |
| Heat resistance stabilizer (F) |  | 0.1 | 0.2 | 0.2 | 0.02 |
| Grafted silane amount (ppm) |  | 2910 | 2930 | 2750 | 2950 |
| Metal residue (ppm) |  | 0.9 | 35 | 0.04 | 53 |
| Initial adhesion strength to glass [N/cm] |  | 21.1 | 21.9 | 17.5 | 21.9 |
| Adhesion strength to backsheet [N/cm] |  | 20.7 | 20.8 | 16.5 | 20.8 |
| Adhesion strength to thin-film electrode [N/cm] |  | 20.9 | 21.1 | 16.6 | 21.4 |
| Constant temp./ humidity test 85° C. × 85% Rh, 2000 h | Adhesion strength to glass [N/cm] | 19.7 | 20.1 | 13.5 | 16.8 |
|  | Adhesion strength Retention [%] | 93 | 92 | 77 | 77 |
| High-intensity xenon exposure test BPT83° C. no rain 2000 h | Adhesion strength to glass [N/cm] | 19.1 | 19.5 | 13.4 | 16.5 |
|  | Adhesion strength Retention [%] | 91 | 89 | 77 | 75 |
| Heat cycle test −40° C. to 90° C. 200 cycles (1200 h) | Adhesion strength to glass [N/cm] | 19.0 | 19.2 | 13.3 | 16.4 |
|  | Adhesion strength Retention [%] | 90 | 88 | 76 | 75 |
| Dielectric breakdown strength [kV/mm] |  | 75 | 76 | 79 | 62 |
| Silver electrode corrosion (visual observation after high-intensity xenon exposure test) |  | No corrosion | No corrosion | Corrosion | No corrosion |

Comparative Example 7

A polymer blend is produced as in Example 1 except that the type of ethylene polymer (A) and the amount of tris(2,4-di-tert-butylphenyl)phosphite, heat-resistance stabilizer (F), are changed as shown in Table 8, and a sheet is molded from the polymer blend. The sheet is evaluated as described above, results of which are shown in Table 8. The molded sheet has a high metal residue content and thus shows low dielectric breakdown strength. The molded sheet also has reduced adhesion strength retention after the constant temperature/humidity test, high-intensity xenon exposure test and heat cycle test.

Example 18

A polymer blend is produced as in Example 1 except that ethylene polymer (A)1' is changed to a mixture of 90 weight parts of ethylene polymer (A)1' and 10 weight parts of ethylene polymer (A)3, that the amount of vinyl methoxysilane as ethylenically-unsaturated silane compound (B)1 is changed to 0.3 weight parts, and that organic peroxide 1 is changed to 0.01 weight parts of t-butylperoxy-2-ethylhexylcarbonate, organic peroxide 2, and then a sheet is molded from the polymer blend. The sheet is evaluated as described above, results of which are shown in Table 9.

Example 19

A polymer blend is produced as in Example 1 except that ethylene polymer (A)1' is changed to a mixture of 90 weight parts of ethylene polymer (A)21' and 10 weight parts of ethylene polymer (A)3 and that the amount of vinyl methoxysilane as ethylenically-unsaturated silane compound (B)1 is changed to 2.5 weight parts, and a sheet is molded from the polymer blend. The sheet is evaluated as described above. Note that the conditions for the vacuum lamination process in which to fabricate a thin-film electrode-deposited glass/sheet sample/backsheet stack are changed as follows: hot plate temperature=150° C., vacuum time=2 minutes, and heating time=6 minutes. Results are shown in Table 9.

Example 20

A polymer blend is produced as in Example 19 except that ethylenically-unsaturated silane compound (B)1 (vinyl methoxysilane) is changed to ethylenically-unsaturated silane compound (B)2,3-acryloxypropyltrimethoxysilane, and a sheet is molded from the polymer blend. The sheet is evaluated as described above. Note that the conditions for the vacuum lamination process in which to fabricate a thin-film electrode-deposited glass/sheet sample/backsheet stack are changed as follows: hot plate temperature=150° C., vacuum time=2 minutes, and heating time=6 minutes. Results are shown in Table 9.

TABLE 9

|  |  | Ex. 18 | Ex. 19 | Ex. 20 |
|---|---|---|---|---|
| Ethylene polymer (A)1' | | 90 | | |
| Ethylene polymer (A)21' | | | 90 | 90 |
| Ethylene polymer (A)3 | | 10 | 10 | 10 |
| Ethylenically-unsaturated silane compound (B)1 | | 0.3 | 2.5 | |
| Ethylenically-unsaturated silane compound (B)2 | | | | 2.5 |
| Organic peroxide 1 | | | 0.05 | 0.05 |
| Organic peroxide 2 | | 0.01 | | |
| UV absorber (D) | | 0.4 | 0.4 | 0.4 |
| Radical scavenger (E) | | 0.1 | 0.1 | 0.1 |
| Heat resistance stabilizer (F) | | 0.1 | 0.1 | 0.1 |
| Grafted silane amount (ppm) | | 640 | 2960 | 1800 |
| Free silane content [%] | | 5 | 25 | 40 |
| Initial adhesion strength to glass [N/cm] | | 14.7 | 22.3 | 16.8 |
| Initial adhesion strength to backsheet [N/cm] | | 10.1 | 21.5 | 16.4 |
| Adhesion strength to thin-film electrode [N/cm] | | 10.2 | 22.0 | 17.1 |
| Constant temp./humidity test 85° C. × 85% Rh, 2000 h | Adhesion strength to glass [N/cm] | 13.2 | 20.3 | 15.1 |
|  | Adhesion strength Retention [%] | 90 | 91 | 90 |
| High-intensity xenon exposure test BPT83° C. no rain 2000 h | Adhesion strength to glass [N/cm] | 13.1 | 20.1 | 15.2 |
|  | Adhesion strength Retention [%] | 89 | 90 | 90 |
| Heat cycle test −40° C. to 90° C. 200 cycles (1200 h) | Adhesion strength to glass [N/cm] | 13.2 | 20.1 | 15.1 |
|  | Adhesion strength Retention [%] | 90 | 90 | 90 |
| Adhesion strength to backsheet after 6 month storage [N/cm] | | 9.1 | 20.1 | 15.2 |
| Retention ratio of adhesion strength to backsheet after 6 month storage [N/cm] | | 90 | 93 | 93 |
| Dielectric breakdown strength [kV/mm] | | 75 | 78 | 77 |
| Gel fraction [%] | | 0.5 or less | 0.5 or less | 0.5 or less |

Synthesis Example of Ethylene/α-Olefin Copolymer 1

In a stainless steel polymerization reactor (capacity: substantially 1 L) fitted with a blade stirrer, polyethylene is continuously copolymerized with 1-butene at polymerization temperature of 105° C. and at a stirrer speed of 500 rpm. Specifically, the copolymerization reaction is effected by continuously feeding hexane at a rate of 1.60 L/h, ethylene at a rate of 56 g/h, 1-butene at a rate of 170 g/h hydrogen at a rate of 1.4 NL/h, [dimethyl(t-butylamide)(tetramethyl-η5-cyclopentadienyl)silane]titanium dichloride at a rate of 0.0004 mmol/h, triphenylcarbenium(tetrakispentafluorophenyl)borate at a rate of 0.004 mmol/h, and triisobutylaluminum at a rate of 0.2 mmol/h, to the liquid phase from the side wall of the polymerization reactor while retaining the polymerization pressure at 3.8 MPaG. The resultant ethylene/1-butene copolymer in hexane is stored in a hold drum, and the polymerization reaction is quenched by the addition of methanol (0.2 ml/h) as a catalyst deactivator.

The ethylene/1-butene copolymer in hexane is drained from the drum every 1 hour, allowing a polymer to be precipitated from the polymerization solution in 2 L methanol. The polymer is dried under vacuum at 130° C. for 10 hours to afford an ethylene/1-butene copolymer (yield: 47.3 g/h).

Synthesis Example of Ethylene/α-Olefin Copolymer 2

An ethylene/1-butene copolymer is synthesized as in Synthesis Example 1 except that 1-butene is changed to 1-octene (80 g/h) and that the feeding rates of hexane, dimethyl(t-butylamide)(tetramethyl-η5-cyclopentadienyl)silane]titanium dichloride, triphenylcarbenium(tetrakispentafluorophenyl)borate and triisobutylaluminum are changed to 1.8 L/h, 0.0002 mmol/h, 0.002 mmol/h and 0.05 mmol/h, respectively (yield: 46.7 g/h).

Physical properties of ethylene/α-olefin copolymers (C) synthesized in Synthesis Examples 1 and 2 are measured in the same manner as described above. However, molecular weight distribution (Mw/Mn) and MFR10/MFR2 ratio are measured as described below. Results are shown in Table 10.

Molecular Weight Distribution (Mw/Mn) of Ethylene/α-Olefin Copolymer (C)

The molecular weight distribution (Mw/Mn) is measured on a gel permeation chromatograph using Waters Alliance GPC 2000 under the following conditions:

Separation columns: TSKgel GNH6*HT, TSKgel GNH6-HTL

Column size: 7.5 mm in inner diameter and 300 mm in length

Column temperature: 140° C.

Mobile phase: o-dichlorobenzene (Wako Pure Chemical Industries, Ltd.) with 0.025 wt % antioxidant BHT (Takeda Pharmaceutical Company Ltd.)

Mobile phase flow rate: 1.0 ml/min

Sample concentration: 15 mg/10 ml

Sample injection volume: 500 μl

Detector: differential refractometer

Standard polystyrenes (Mw<1000, Mw>4×$10^6$): standard polystyrene available from Tosoh Corporation Standard polystyrene (100M≤Mw≤4×$10^6$): standard polystyrene available from Pressure Chemical Company The universal calibration curve is generated using the polystyrene standards to calculate the molecular weights in terms of ethylene/α-olefin copolymer for the different α-olefins used.

MFR10/MFR2 Ratio

1) Measurement of MFR10

MFR10 is measured in accordance with JIS K-6721 at 190° C. under a load of 10 kg.

2) Using MFR10 thus measured and MFR2 measured as described above, MFR10/MFR2 ratio is calculated.

TABLE 10

|  | Ethylene/α-olefin copolymer 1 | Ethylene/α-olefin copolymer 2 |
|---|---|---|
| Density [kg/m³] | 860 | 894 |
| α-olefin content [mol %] | 20 | 9 |
| Peak melt temp [° C.] | 35 | 85 |
| MFR2 [g/10 min] | 3.8 | 0.11 |
| MFR10/MFR2 [—] | 6.7 | 6.5 |
| Mw/Mn [—] | 2.1 | 2.1 |
| Metal residue [ppm] | 57 | 29 |

Example 21

A polymer blend is produced as in Example 1 except that ethylene polymer (A)1' is changed to a mixture of 70 weight parts of ethylene polymer (A)21', 10 weight parts of ethylene polymer (A)3 and 20 weight parts of ethylene/α-olefin copolymer 1, and that the amount of vinyl methoxysilane as ethylenically-unsaturated silane compound (B)1 is changed to 2 weight parts, and then a sheet is molded from the polymer blend. Note that the conditions for the vacuum laminator used to fabricate a thin-film electrode-deposited glass/sheet sample/backsheet stack are changed as follows: hot plate temperature=150° C., vacuum time=2 minutes, and heating time=6 minutes. The molded sheet is evaluated as in Example 1, results of which are shown in Table 11.

Example 22

A polymer blend is produced as in Example 1 except that ethylene polymer (A)1' is changed to a mixture of 10 weight parts of ethylene polymer (A)3 and 90 weight parts of ethylene/α-olefin copolymer 2, and that the amount of vinyl methoxysilane as ethylenically-unsaturated silane compound (B)1 is changed to 2 weight parts, and then a sheet is molded from the polymer blend. The molded sheet is evaluated as in Example 1, results of which are shown in Table 11.

TABLE 11

|  |  | Ex. 21 | Ex. 22 |
|---|---|---|---|
| Ethylene polymer (A)21' | | 70 | |
| Ethylene polymer (A)3 | | 10 | 10 |
| Ethylene/α-olefin copolymer 1 | | 20 | |
| Ethylene/α-olefin copolymer 2 | | | 90 |
| Ethylenically-unsaturated silane compound (B)1 | | 2 | 2 |
| Organic peroxide 1 | | 0.05 | 0.05 |
| UV absorber (D) | | 0.4 | 0.4 |
| Radical scavenger (E) | | 0.1 | 0.1 |
| Heat resistance stabilizer (F) | | 0.1 | 0.1 |
| Total density of ethylene polymer (A) and Ethylene/α-olefin copolymer [kg/m³] | | 901 | 897 |
| Grafted silane amount (ppm) | | 2860 | 2850 |
| Metal residue (ppm) | | 17 | 27 |
| Initial adhesion strength to glass [N/cm] | | 23.1 | 29.2 |
| Adhesion strength to backsheet [N/cm] | | 20.5 | 17.5 |
| Adhesion strength to thin-film electrode [N/cm] | | 14.3 | 20.3 |
| Constant temp./ humidity test 85° C. × 85% Rh, 2000 h | Adhesion strength to glass [N/cm] | 21.8 | 28.1 |
| | Adhesion strength Retention [%] | 94 | 96 |
| High-intensity xenon exposure test BPT83° C. no rain 2000 h | Adhesion strength to glass [N/cm] | 21.5 | 27.6 |
| | Adhesion strength Retention [%] | 93 | 95 |
| Heat cycle test −40° C. to 90° C. 200 cycles (1200 h) | Adhesion strength to glass [N/cm] | 21.5 | 27.7 |
| | Adhesion strength Retention [%] | 93 | 95 |
| Dielectric breakdown strength [kV/mm] | | 71 | 73 |
| Gel fraction [%] | | 0.5 or less | 0.5 or less |

Example 23

As a back protective member for solar cell modules, an ozone-treated polyethylene terephthalate backsheet ("LIPTEA" Lintec Corporation) is loaded on the surface of the first roll, followed by extrusion lamination molding of the ethylene resin composition of Example 19. This affords an encapsulant material for solar cells in which the encapsulant material is integrated with the back protective member, the encapsulant material having adhesion to backsheet, silver electrode and glass comparable to that prepared in Example 19.

Example 24

As a back protective member for solar cell modules, an ozone-treated polyethylene terephthalate backsheet ("LIPTEA" Lintec Corporation) is loaded on the surface of the first roll, followed by extrusion lamination molding of the ethylene resin composition of Example 21. This affords an encapsulant material for solar cells in which the encapsulant material is integrated with the back protective member, the encapsulant material having adhesion to backsheet, silver electrode and glass comparable to that prepared in Example 21.

Example 25

The encapsulant material for solar cells of Example 23 in which the encapsulant material is integrated with the back protective member is provided. The encapsulant material, a commercially available EVA encapsulant material ("Solar EVA" Mitsui Chemical Fablo Inc.) and glass are sequentially stacked. The stack is placed on a hot plate set at 150° C. in a vacuum laminator, laminated under vacuum for 2 minutes, and heated for 13 minutes. In this way a glass/EVA/encapsulant material/back protective member stack is fabricated. The laminated stack is then allowed to stand in an air-circulating oven set at 150° C. for 60 hours for crosslinking of EVA. In this way a glass/EVA/encapsulant material/back protective member stack is fabricated. The stack is cut to a width of 15 mm, and a 180 degree peel strength of the encapsulant material of Example 23 to EVA is measured. Sufficient adhesion strength is exerted between EVA and encapsulant material of Example 25 to an extent that breaks the encapsulant material.

Example 26

The encapsulant material for solar cells of Example 24 in which the encapsulant material is integrated with the back protective member is provided. As in Example 25, a glass/EVA/encapsulant material/back protective member stack is fabricated. The stack is to a width of 15 mm, and a 180 degree peel strength of the encapsulant material of Example 24 to EVA is measured. Sufficient adhesion strength is exerted between EVA and encapsulant material of Example 26 to an extent that breaks the encapsulant material.

Example 27

A sheet sample of the encapsulant material of Example 5 is sandwiched between a pair of glass plates on which silver is deposited on the center by sputtering (hereinafter simply referred to as "thin-film electrode"). The stack is placed on a hot plate set at 150° C. in a vacuum laminator, laminated under vacuum for 2 minutes, and heated for 13 minutes. In this way a thin-film electrode-deposited glass/sheet sample/thin-film electrode-deposited glass stack is fabricated. The laminate is placed into a constant temperature/humidity tester, and the state of the silver electrodes after 2,000 hours is observed. As a result, no corrosion is observed on the silver electrodes. Moisture permeability of the stack is also shown in Table 12.

Example 28

Using a sheet sample of the encapsulant material of Example 19, a thin-film electrode-deposited glass/sheet sample/thin-film electrode-deposited glass stack is fabricated as in Example 27. The laminate is placed into a constant temperature/humidity tester, and the state of the silver electrodes after 2,000 hours is observed. As a result, no corrosion is observed on the silver electrodes. Moisture permeability of the stack is also shown in Table 12.

Example 29

Using a sheet sample of the encapsulant material of Example 21, a thin-film electrode-deposited glass/sheet sample/thin-film electrode-deposited glass stack is fabricated as in Example 27. The laminate is placed into a constant temperature/humidity tester, and the state of the silver electrodes after 2,000 hours is observed. As a result, no corrosion is observed on the silver electrodes. Moisture permeability of the stack is also shown in Table 12.

Comparative Example 8

A 0.5 mm-thick sheet sample of a commercially available EVA encapsulant material ("Solar EVA" Mitsui Chemical Fablo Inc.) is sandwiched between a pair of glass plates on which silver is deposited on the center by sputtering (hereinafter simply referred to as "thin-film electrode"). The stack is placed on a hot plate set at 150° C. in a vacuum laminator, laminated under vacuum for 2 minutes, and heated for 13 minutes. In this way a thin-film electrode-deposited glass/sheet sample/thin-film electrode-deposited glass stack is fabricated. The laminated stack is then allowed to stand in an air-circulating oven set at 150° C. for 60 hours for crosslinking of EVA. In this way a thin-film electrode-deposited glass/sheet sample/thin-film electrode-deposited glass stack is fabricated. The laminate is placed into a constant temperature/humidity tester, and the state of the silver electrodes after 2,000 hours is observed. As a result, the state of the silver electrodes is changed with slight corrosion. Moisture permeability of the stack is also shown in Table 12.

TABLE 12

|  | Ex. 27 | Ex. 28 | Ex. 29 | Comp. Ex. 8 |
|---|---|---|---|---|
| Ethylene polymer (A)1' | 90 |  |  | Commercially available EVA |
| Ethylene polymer (A)21' |  | 90 | 70 |  |
| Ethylene polymer (A)3 | 10 | 10 | 10 |  |
| Ethylene/α-olefin copolymer 1 |  |  | 20 |  |
| Ethylenically-unsaturated silane compound (B)1 | 1.5 | 2.5 | 2 |  |
| Organic peroxide 1 | 0.05 | 0.05 | 0.05 |  |
| UV absorber (D) | 0.4 | 0.4 | 0.4 |  |
| Radical scavenger (E) | 0.1 | 0.1 | 0.1 |  |
| Heat resistance stabilizer (F) | 0.1 | 0.1 | 0.1 |  |
| Moisture permeability [g · mm/m$^2$ · day] | 0.09 | 0.15 | 0.23 | 5.20 |
| State of silver electrode after constant temperature/humidity test | A | A | A | B |

Example 30

A polymer blend is produced as in Example 1 except that ethylene polymer (A)1' is changed to a mixture of 90 weight parts of ethylene polymer (A)21' and 10 weight parts of ethylene polymer (A)3, that the amount of vinyl methoxysilane as ethylenically-unsaturated silane compound (B)1 is changed to 2 weight parts, and that the amount of 2,5-dimethyl-2,5-di(t-butylperoxy)hexane as organic peroxide 1 is changed to 0.03 weight parts. A sheet is then molded from the polymer blend as in Example 1 except that the sheet's porosity P is changed to 10% by changing the embossing roll of the first chill roll. The molded sheet is evaluated as described above, results of which are shown in Table 13.

Example 31

A polymer blend is produced as in Example 30 except that the amount of tris(2,4-di-tert-buthylphenyl)phosphite, heat resistance stabilizer (F), is changed to 0.2 weight parts. A sheet is then molded from the polymer blend as in Example 1 except that the sheet's porosity P is changed to 50% by changing the embossing roll of the first chill roll. The molded sheet is evaluated as described above, results of which are shown in Table 13.

Example 32

A polymer blend is produced as in Example 30 except that the mixture of ethylene polymer (A)21' and ethylene polymer (A)3 is changed to 100 weight parts of ethylene polymer (A)4' and that the amount of tris(2,4-di-tert-buthylphenyl)phosphite, heat resistance stabilizer (F), is changed to 0.2 weight parts, and a sheet is molded from the polymer blend. The molded sheet is evaluated as described above, results of which are shown in Table 13.

Example 33

A polymer blend is produced as in Example 31 except that the mixture of ethylene polymer (A)21' and ethylene polymer (A)3 is changed to a mixture of 10 weight parts of ethylene polymer (A)21', 10 weight parts of ethylene polymer (A)3 and 80 weight parts of ethylene/α-olefin copolymer 1, and a sheet is molded from the polymer blend. The molded sheet is evaluated as described above, results of which are shown in Table 13.

TABLE 13

|  | Ex. 30 | Ex. 31 | Ex. 32 | Ex. 33 |
| --- | --- | --- | --- | --- |
| Ethylene polymer (A)21' | 90 | 90 |  | 10 |
| Ethylene polymer (A)4' |  |  | 100 |  |
| Ethylene polymer (A)3 | 10 | 10 |  | 10 |
| Ethylene/α-olefin copolymer 1 |  |  |  | 80 |
| Ethylenically-unsaturated silane compound (B)1 | 2 | 2 | 2 | 2 |
| Organic peroxide 1 | 0.03 | 0.03 | 0.03 | 0.03 |
| UV absorber (D) | 0.4 | 0.4 | 0.4 | 0.4 |
| Radical scavenger (E) | 0.1 | 0.1 | 0.1 | 0.1 |
| Heat resistance stabilizer (F) | 0.1 | 0.2 | 0.2 | 0.2 |
| Porosity P [%] | 10 | 50 | 10 | 50 |
| Solid Viscoelasticity: storage modulus at 80° C. [Pa] | $1.5 \times 10^7$ | $2.5 \times 10^6$ | $1.3 \times 10^8$ | $2.6 \times 10^5$ |
| State of thin-film electrode after lamination | Good | Good | Good | Good |
| State of laminator after lamination | Good | Good | Good | Good |
| State of silver electrode after constant temperature/humidity test | A | A | A | A |

As seen from Table 13, Examples 30 to 33 provided good results without causing such problems as cracks in the thin-film cells after the lamination process. The laminator is also in good condition, without being contaminated with the encapsulant material. Moreover, the state of the silver electrodes after the constant temperature/humidity test is good, without particular corrosion.

This application is entitled and claims the priority of Japanese Patent Application No. 2009-132432 filed on Jun. 1, 2009 and Japanese Patent Application No. 2009-238653 filed on Oct. 15, 2009, the disclosure of each of which including the specification, drawings and abstract is incorporated herein by reference in their entirety.

INDUSTRIAL APPLICABILITY

The present invention relates to an ethylene resin composition which has good adhesion to glass, a backsheet and a thin-film electrode as well as good electrical insulation properties, transparency, moldability, long-term storage ability, cushioning properties and process moldability, and relates to an encapsulant material for solar cells made of the same. The present invention also relates to a solar cell module prepared using the encapsulant material or sheet for solar cells. Moreover, since the ethylene resin composition has specific ranges of storage modulus and porosity, it is possible to avoid breakage of solar cells and air entrapment during the lamination process for a solar cell module.

The encapsulant material for solar cells of the present invention has good heat resistance, humidity resistance and adhesion, and thus is useful as encapsulant material for solar cells for thin-film solar cell modules, particular as encapsulant material for solar cells used at the backside of crystalline solar cell modules.

REFERENCE SIGNS LIST

20 Solar cell module
22 Solar cell
22A Light-incident surface (of solar cell).
22B Back surface (of solar cell).
24 Front protective member
26 Back protective member
28 Encapsulant layer
29 Interconnector
32 Collector line
34A, 34B Tab-type busbar
36 Conductive layer

The invention claimed is:
1. An ethylene resin composition comprising:
a modified product produced by modifying ethylene polymer (A) with ethylenically-unsaturated silane compound (B), the ethylene polymer (A) satisfying all of the following requirements a) to e):

a) density=900 to 940 kg/m$^3$;
b) Peak melt temperature as measured by DSC=90° C. to 125° C.;
c) Melt flow rate (MFR2) as measured in accordance with JIS K-6721 at 190° C. under a load of 2.16 kg=0.1 to 100 g/10 min;
d) Mw/Mn ratio=1.2 to 3.5;
e) Metal residue content=0.1 to 50 ppm, and
a modified product produced by modifying ethylene/a-olefin copolymer (C) with ethylenically-unsaturated silane compound (B).

2. The ethylene resin composition according to claim 1, wherein the ethylene/α-olefin copolymer (C) satisfies the following requirement f): f) density=850 to less than 895 kg/m$^3$.

3. The ethylene resin composition according to claim 1, wherein the ethylene resin composition satisfies the following requirement g): g) an amount of free silane derived from the ethylenically-unsaturated silane compound (B) remaining in the ethylene resin composition is 5 to 40 wt %.

4. The ethylene resin composition according to claim 1, wherein the modified product of the ethylene polymer (A) is produced by melt-extrusion of a mixture of the ethylene polymer (A), the ethylenically-unsaturated silane compound (B), and an organic peroxide.

5. The ethylene resin composition according to claim 1, wherein the modified product of the ethylene/a-olefin copolymer (C) is produced by melt-extrusion of a mixture of the ethylene/a-olefin copolymer (C), the ethylenically-unsaturated silane compound (B), and an organic peroxide.

6. The ethylene resin composition according to claim 4, wherein the ethylene polymer (A) is in the form of powder.

7. The ethylene resin composition according to claim 4, wherein the ethylene polymer (A) is in the form of a mixture of powder and pellet.

8. The ethylene resin composition according to claim 4, wherein the mixture is a mixture of a powder of the ethylene polymer (A) and a pellet of the ethylene polymer (A), the powder previously impregnated with the ethylenically-unsaturated silane compound (B) and the organic peroxide.

9. The ethylene resin composition according to claim 1, further comprising at least one additive selected from the group consisting of UV absorber (D), light stabilizer (E), and heat resistance stabilizer (F).

10. The ethylene resin composition according to claim 1, wherein an amount of the modified product of the ethylene/a-olefin copolymer (C) is 90 weight parts or less per 100 weight parts of a total amount of the modified product of the ethylene polymer (A) and the modified product of the ethylene/α-olefin copolymer (C).

11. An encapsulant material for solar cells comprising the ethylene resin composition according to claim 1.

12. An encapsulant material for solar cells comprising a sheet made of the ethylene resin composition according to claim 1.

13. The encapsulant material according to claim 11, wherein at least one side of the encapsulant material is embossed, porosity P is 10% to 50%, the porosity P being defined as a percentage ratio of total volume $V_H$ to apparent volume $V_A$ of the encapsulant material ($V_H/V_A \times 100$), where the total volume $V_H$ is a total volume of concaved portions per unit area of the encapsulant material, and the apparent volume $V_A$ is obtained by multiplying the unit area by a maximum thickness of the encapsulant material, and storage modulus (E') at 80° C. is $2.5 \times 10^5$ Pa to $1.5 \times 10^8$ Pa.

14. The encapsulant material according to claim 11, wherein the encapsulant material is integrated with a back protective member for solar cell modules.

15. A solar cell module manufactured using the encapsulant material according to claim 11.

16. A thin-film solar cell module manufactured using the encapsulant material according to claim 11.

17. A crystalline solar cell module manufactured using the encapsulant material according to claim 11 as an encapsulant material for a backside of the solar cell module.

18. The ethylene resin composition according to claim 1, wherein the ethylene polymer (A) is not identical to the ethylene polymer (C).

* * * * *